(12) United States Patent
Yota et al.

(10) Patent No.: US 11,335,669 B2
(45) Date of Patent: May 17, 2022

(54) WAFER LEVEL CHIP SCALE FILTER PACKAGING USING SEMICONDUCTOR WAFERS WITH THROUGH WAFER VIAS

(71) Applicant: SKYWORKS SOLUTIONS, INC., Irvine, CA (US)

(72) Inventors: Jiro Yota, Westlake Village, CA (US); Hong Shen, Palo Alto, CA (US); Viswanathan Ramanathan, Thousand Oaks, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 95 days.

(21) Appl. No.: 16/683,592

(22) Filed: Nov. 14, 2019

(65) Prior Publication Data

US 2020/0083202 A1     Mar. 12, 2020

Related U.S. Application Data

(62) Division of application No. 15/912,924, filed on Mar. 6, 2018, now Pat. No. 10,483,248.

(Continued)

(51) Int. Cl.
    *H03H 3/02*             (2006.01)
    *H03H 3/08*             (2006.01)
(Continued)

(52) U.S. Cl.
    CPC ........ *H01L 25/16* (2013.01); *H01L 21/30604* (2013.01); *H01L 21/6835* (2013.01);
(Continued)

(58) Field of Classification Search
CPC .. H03H 9/1071; H03H 9/1014; H03H 9/0547; H03H 9/1007; H03H 9/1064; H03H 9/542; H03H 9/64; H03H 9/02559; H03H 3/02; H03H 3/08; B81B 3/001; B81B 2203/0315; B81B 2203/0109–019; B81C 1/00047; B81C 2203/0109–019; B81C 1/00269; H01L 25/16; H01L 23/06; H01L 23/3171; H01L 23/3114; H01L 23/585; H01L 23/481; H01L 23/66; H01L 24/05; H01L 24/08; H01L 24/89; H01L 41/0475; H01L 41/1876; H01L 41/33;
(Continued)

(56) References Cited

U.S. PATENT DOCUMENTS

| | | | |
|---|---|---|---|
| 6,445,265 B1 * | 9/2002 | Wright | H03H 3/08 333/193 |
| 7,042,056 B2 * | 5/2006 | Koshido | H03H 3/08 257/414 |

(Continued)

FOREIGN PATENT DOCUMENTS

EP       1653613 A1 *    5/2006           H03H 9/6433

*Primary Examiner* — Mary A Wilczewski
(74) *Attorney, Agent, or Firm* — Lando & Anastasi, LLP

(57) ABSTRACT

A method of fabricating an electronics package includes forming a cavity in a first surface of a semiconductor substrate, forming one or more passive devices on the semiconductor substrate, forming a microelectromechanical device on a piezoelectric substrate, and bonding the semiconductor substrate to the piezoelectric substrate with the microelectromechanical device disposed within the cavity.

20 Claims, 30 Drawing Sheets

Related U.S. Application Data

(60) Provisional application No. 62/475,386, filed on Mar. 23, 2017.

(51) Int. Cl.

| | | |
|---|---|---|
| *H01L 21/306* | (2006.01) | |
| *H01L 21/768* | (2006.01) | |
| *H01L 21/78* | (2006.01) | |
| *H03H 9/05* | (2006.01) | |
| *H03H 9/10* | (2006.01) | |
| *H03H 9/64* | (2006.01) | |
| *H01L 25/16* | (2006.01) | |
| *H01L 23/31* | (2006.01) | |
| *H01L 23/48* | (2006.01) | |
| *H01L 23/58* | (2006.01) | |
| *H01L 41/047* | (2006.01) | |
| *H01L 23/00* | (2006.01) | |
| *H01L 21/683* | (2006.01) | |
| *H01L 23/06* | (2006.01) | |
| *H03H 9/02* | (2006.01) | |
| *H01L 23/26* | (2006.01) | |
| *H01L 23/08* | (2006.01) | |
| *H01L 23/66* | (2006.01) | |
| *H01L 41/04* | (2006.01) | |
| *H01L 41/053* | (2006.01) | |
| *H01L 41/187* | (2006.01) | |
| *H01L 49/02* | (2006.01) | |
| *H01L 29/861* | (2006.01) | |
| *H01L 41/33* | (2013.01) | |
| *H03H 9/00* | (2006.01) | |

(52) U.S. Cl.
CPC .......... *H01L 23/06* (2013.01); *H01L 23/3114* (2013.01); *H01L 23/3171* (2013.01); *H01L 23/481* (2013.01); *H01L 23/585* (2013.01); *H01L 24/05* (2013.01); *H01L 24/08* (2013.01); *H01L 24/89* (2013.01); *H01L 41/0475* (2013.01); *H03H 3/02* (2013.01); *H03H 3/08* (2013.01); *H03H 9/0547* (2013.01); *H03H 9/1007* (2013.01); *H03H 9/1064* (2013.01); *H03H 9/64* (2013.01); *H01L 21/76898* (2013.01); *H01L 21/78* (2013.01); *H01L 23/66* (2013.01); *H01L 28/10* (2013.01); *H01L 28/40* (2013.01); *H01L 29/861* (2013.01); *H01L 41/1875* (2013.01); *H01L 41/1876* (2013.01); *H01L 41/33* (2013.01); *H01L 2221/6834* (2013.01); *H01L 2221/68327* (2013.01); *H01L 2221/68381* (2013.01); *H01L 2223/6627* (2013.01); *H01L 2224/08145* (2013.01); *H03H 9/0004* (2013.01); *H03H 9/02559* (2013.01)

(58) Field of Classification Search
CPC ........... H01L 41/1875; H01L 21/30604; H01L 21/6835; H01L 21/76898; H01L 21/78; H01L 2221/6834; H01L 2221/68381; H01L 2221/68327; H01L 28/10; H01L 28/40; H01L 29/861
See application file for complete search history.

(56) References Cited

U.S. PATENT DOCUMENTS

| | | | | |
|---|---|---|---|---|
| 7,258,472 | B2 * | 8/2007 | Tufte | B60Q 1/32 362/505 |
| 7,615,833 | B2 | 11/2009 | Larson, III et al. | |
| 7,732,991 | B2 | 6/2010 | Liu | |
| 7,736,931 | B1 * | 6/2010 | Guo | G01P 15/02 438/52 |
| 8,035,176 | B2 * | 10/2011 | Jung | B81C 1/0023 257/415 |
| 8,237,256 | B2 * | 8/2012 | Verjus | H01L 24/10 257/690 |
| 8,552,622 | B2 * | 10/2013 | Makibuchi | H03H 9/1071 310/344 |
| 8,872,409 | B2 * | 10/2014 | Iwamoto | H03H 3/02 310/313 R |
| 9,058,455 | B2 | 6/2015 | Adkisson et al. | |
| 9,197,184 | B2 * | 11/2015 | Iwamoto | H01L 41/053 |
| 9,362,139 | B2 * | 6/2016 | Ebefors | H01L 23/552 |
| 9,395,533 | B2 | 7/2016 | Sasagawa | |
| 9,440,848 | B2 | 9/2016 | Sasagawa et al. | |
| 9,448,251 | B2 | 9/2016 | Liu | |
| 9,647,199 | B2 * | 5/2017 | Ito | H03H 3/02 |
| 9,751,109 | B2 * | 9/2017 | Moriya | B06B 1/0662 |
| 10,020,789 | B2 | 7/2018 | Adkisson et al. | |
| 10,228,353 | B2 | 3/2019 | Rothberg et al. | |
| 10,483,248 | B2 * | 11/2019 | Yota | H03H 9/1007 |
| 10,559,741 | B2 * | 2/2020 | Bulger | H03H 9/0538 |
| 10,665,566 | B2 * | 5/2020 | Kuroyanagi | H01L 24/12 |
| 10,707,830 | B2 * | 7/2020 | Kikuchi | H03H 3/08 |
| 2003/0060172 | A1 | 3/2003 | Kuriyama et al. | |
| 2006/0001123 | A1 * | 1/2006 | Heck | B81C 1/0023 257/528 |
| 2006/0214745 | A1 * | 9/2006 | Park | H03H 9/587 333/133 |
| 2007/0252481 | A1 * | 11/2007 | Iwamoto | H03H 9/72 310/344 |
| 2008/0087530 | A1 | 4/2008 | Paranjpye et al. | |
| 2009/0001849 | A1 * | 1/2009 | Tsuda | H03H 9/0547 310/313 R |
| 2009/0030291 | A1 | 1/2009 | O'Brien et al. | |
| 2009/0224851 | A1 * | 9/2009 | Feiertag | H03H 9/105 333/186 |
| 2010/0308450 | A1 * | 12/2010 | Verjus | H01L 24/13 257/690 |
| 2013/0307372 | A1 * | 11/2013 | Ito | H03H 9/02574 310/311 |
| 2014/0339956 | A1 * | 11/2014 | Kanae | H03H 9/1071 310/311 |
| 2014/0354114 | A1 * | 12/2014 | Moriya | B06B 1/0662 310/334 |
| 2016/0037649 | A1 * | 2/2016 | Barber | H01L 21/50 361/772 |
| 2017/0128983 | A1 * | 5/2017 | Horsley | H01L 41/0475 |
| 2017/0163243 | A1 * | 6/2017 | Bulger | H03H 9/0576 |
| 2017/0214386 | A1 | 7/2017 | Kido | |
| 2017/0250669 | A1 * | 8/2017 | Kuroyanagi | H03H 9/0576 |
| 2017/0272051 | A1 * | 9/2017 | Kurihara | H03H 9/6483 |
| 2017/0283247 | A1 * | 10/2017 | Meyer | B81C 1/00238 |
| 2018/0062618 | A1 | 3/2018 | Nagarkar et al. | |
| 2018/0151534 | A1 * | 5/2018 | Kuroyanagi | H01L 23/488 |
| 2019/0036510 | A1 * | 1/2019 | Kikuchi | H01L 23/34 |
| 2019/0132942 | A1 * | 5/2019 | Yun | H03H 9/0547 |
| 2019/0267361 | A1 * | 8/2019 | Rahim | H03H 9/175 |
| 2019/0273116 | A1 * | 9/2019 | Goktepeli | H01L 27/20 |
| 2019/0305750 | A1 * | 10/2019 | Bulger | H03H 9/0538 |
| 2020/0083202 | A1 * | 3/2020 | Yota | H01L 24/89 |
| 2020/0144986 | A1 * | 5/2020 | Park | H03H 9/1071 |
| 2020/0235716 | A1 * | 7/2020 | Eid | H03H 9/542 |
| 2020/0243369 | A1 * | 7/2020 | Yota | H03H 9/1014 |
| 2020/0287520 | A1 * | 9/2020 | Kamgaing | H03H 7/1766 |
| 2020/0382092 | A1 * | 12/2020 | Li | H03H 9/173 |

* cited by examiner

WAFER LEVEL CHIP SCALE FILTER PACKAGING USING SEMICONDUCTOR WAFERS WITH THROUGH WAFER VIAS

CROSS REFERENCE TO RELATED APPLICATIONS

This application claims priority under 35 U.S.C. § 121 as a Division U.S. patent application Ser. No. 15/912,924, titled "WAFER LEVEL CHIP SCALE FILTER PACKAGING USING SEMICONDUCTOR WAFERS WITH THROUGH WAFER VIAS," filed Mar. 6, 2018, which claims priority under 35 U.S.C. § 119(e) to U.S. provisional patent application Ser. No. 62/475,386, titled "WAFER LEVEL CHIP SCALE FILTER PACKAGING USING SEMICONDUCTOR WAFERS WITH THROUGH WAFER VIAS," filed Mar. 23, 2017, each of which being incorporated by reference herein in its entirety for all purposes.

BACKGROUND

Field of Invention

The present invention relates generally to wafer-level chip-scale packages (WLCSP) and flip-chip designs including both semiconductor devices formed on semiconductor substrates and microelectromechanical systems devices formed on piezoelectric substrates.

Discussion of Related Art

Integrated circuits including, for example, transistors and passive devices are typically formed on semiconductor substrates. If a particular implementation calls for both semiconductor integrated circuit devices and microelectromechanical system devices, for example, surface acoustic wave (SAW) filters or bulk acoustic wave (BAW) filters, these filter elements are typically formed on a piezoelectric substrate separate from a semiconductor substrate on which the semiconductor integrated circuit devices are formed.

SUMMARY

According to one aspect of the present disclosure there is provided an electronics package. The electronics package comprises a semiconductor substrate having one or more passive devices formed thereon and a cavity defined in a first surface thereof. A piezoelectric substrate is bonded to the semiconductor substrate and has a radio frequency (RF) filter formed thereon. The RF filter is disposed within the cavity defined in the semiconductor substrate.

In some embodiments, the one or more passive devices are disposed within the cavity.

In some embodiments, the RF filter is one of a surface acoustic wave filter and a bulk acoustic wave filter.

In some embodiments, the semiconductor substrate includes a plurality of bond pads formed on a second surface thereof.

In some embodiments, the piezoelectric substrate includes one or more bond pads electrically connected to one or more of the plurality of bond pads formed on the second surface of the semiconductor substrate.

In some embodiments, the one or more bond pads of the piezoelectric substrate are electrically connected to the one or more of the plurality of bond pads formed on the second surface of the semiconductor substrate by through-wafer vias passing through the semiconductor substrate.

In some embodiments, the package is configured as a flip-chip package.

In some embodiments, the one or more passive devices are disposed on a second surface of the semiconductor substrate opposite the first surface. The semiconductor substrate may include a plurality of bond pads formed on the second surface thereof.

In some embodiments, the package further includes a seal ring hermetically sealing the cavity.

In some embodiments, side walls and an upper wall of the cavity are coated with a metal film.

In some embodiments, the semiconductor substrate is free of microelectromechanical system (MEMS) devices.

In some embodiments, the package further comprises a passivation film disposed on the semiconductor substrate and one or more passive devices.

In some embodiments, a module for an electronic device includes the electronics package. In some embodiments, an electronic device includes the module.

In accordance with another aspect, there is provided a method of fabricating an electronics package. The method comprises forming a cavity in a first surface of a semiconductor substrate, forming one or more passive devices on the semiconductor substrate, forming a radio frequency (RF) filter on a piezoelectric substrate, and bonding the semiconductor substrate to the piezoelectric substrate with the RF filter disposed within the cavity.

In some embodiments, the one or more passive devices are formed within the cavity.

In some embodiments, the one or more passive devices are formed on a second surface of the semiconductor wafer opposite the first surface.

In some embodiments, the method further comprises forming bond pads for connection to a mounting substrate on the second surface of the semiconductor wafer.

In some embodiments, the method further comprises hermetically sealing the cavity with a metallic seral ring.

In some embodiments, the method comprises bonding the semiconductor substrate to the piezoelectric substrate with a transient liquid phase bond.

BRIEF DESCRIPTION OF DRAWINGS

Various aspects of at least one embodiment are discussed below with reference to the accompanying drawings. In the drawings, which are not intended to be drawn to scale, each identical or nearly identical component that is illustrated in various drawings is represented by a like numeral. For purposes of clarity, not every component may be labeled in every drawing. The drawings are provided for the purposes of illustration and explanation, and are not intended as a definition of the limits of the invention. In the drawings.

DETAILED DESCRIPTION

Various aspects and embodiments disclosed herein relate to an improved design for packaging of devices including both semiconductor integrated circuit elements and acoustic wave filter elements. In accordance with some aspects and embodiments a semiconductor substrate including semiconductor integrated circuit elements is bonded to a piezoelectric substrate including acoustic wave filter elements to form a single package. The single package may be formed as a wafer-level chip-scale package (WLCSP) or as a flip-chip design that may be directly mounted to a printed circuit board or other mounting substrate. Various aspects and embodiments disclosed herein provide for a device package including both semiconductor elements and acoustic wave elements having a reduced size as compared with previous designs.

Figure 1A:
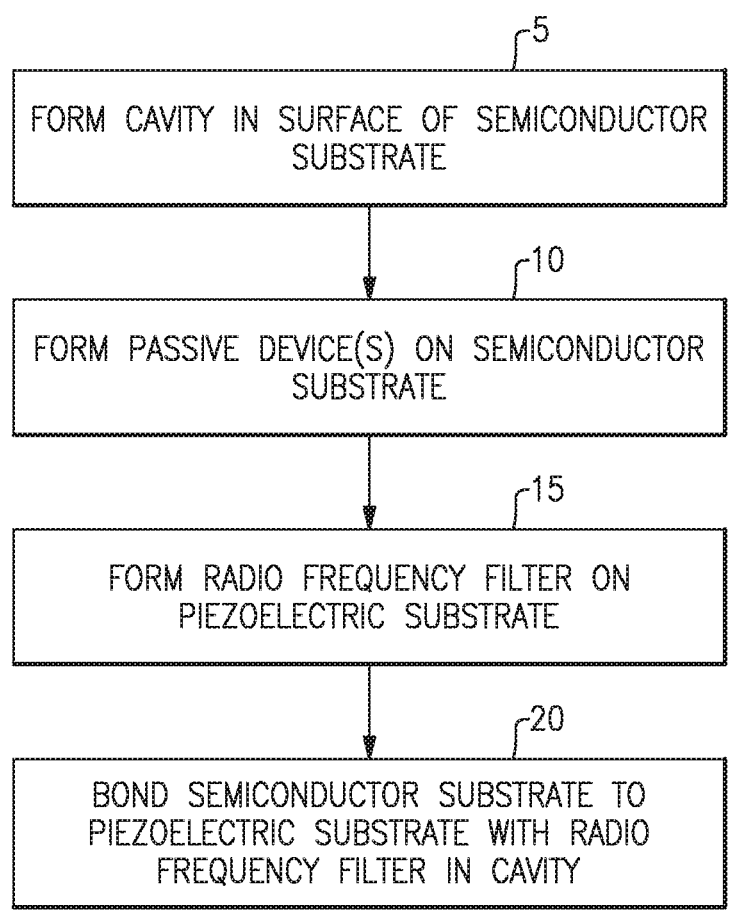
FIG. 1A is a flowchart of a method of fabricating a combined semiconductor/piezoelectric substrate package.

A high level description of a method of forming a combined semiconductor/piezoelectric substrate package is illustrated in the flowchart of FIG. 1A. The method includes forming a cavity in a first surface of a semiconductor substrate (act 5), forming one or more passive devices on the semiconductor substrate (act 10), forming a radio frequency (RF) filter on a piezoelectric substrate (act 15), and bonding the semiconductor substrate to the piezoelectric substrate with the RF filter disposed within the cavity (act 20). The method may be performed with the various acts performed in various orders and with the one or more passive devices and/or the piezoelectric substrate formed on or bonded to different sides or to the same side of the semiconductor substrate. As the terms are used herein a front side or surface of a wafer or substrate is the side or surface in or on which devices are formed and the rear side or surface of a wafer or substrate is the side or surface opposite the front side or surface.

Figure 1B:
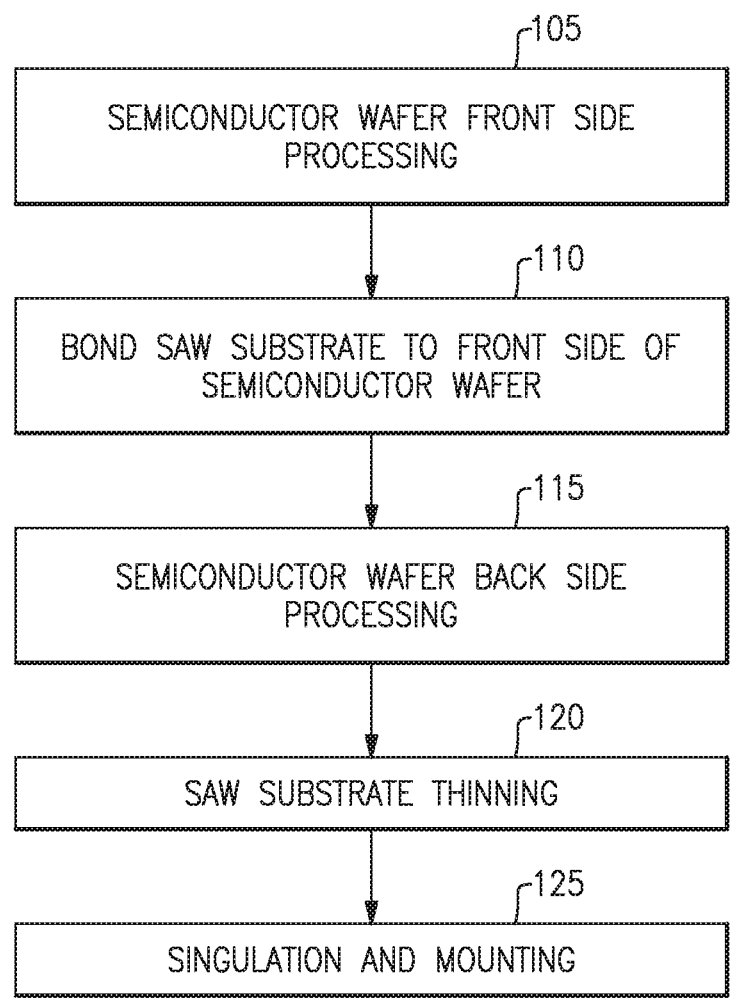
FIG. 1B is a flowchart of another method of fabricating a combined semiconductor/piezoelectric substrate package.
Figure 2A:
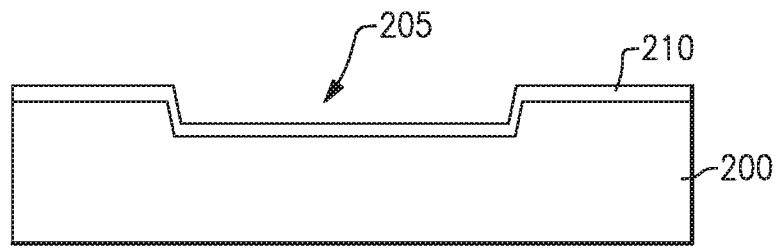
FIGS. 2A-2L illustrate the acts in the method of FIG. 1B.

One particular example of a method of forming a combined semiconductor/piezoelectric substrate package as described in FIG. 1A is illustrated in the flowchart of FIG. 1B and the corresponding FIGS. 2A-2L, illustrating the various process steps. In FIGS. 2A-2L, the formation of a single device package is illustrated. It is to be understood that these figures, as well as the other figures presented herein, illustrate only a small portion of semiconductor and piezoelectric wafers and the method may result in the formation of hundreds or thousands or more of the illustrated devices and packages concurrently prior to singulation into individual device packages. In act 105, processing of a first side (e.g., the front side) of semiconductor substrate is performed. In the front side processing of the semiconductor substrate a cavity 205 is etched into the front side of a portion of a semiconductor wafer 200. The semiconductor wafer 200 may be silicon or gallium arsenide (GaAs) or another form of semiconductor. GaAs may be utilized when fabricating devices that operate at high frequencies, for radiation hardened operation, or for other reasons. The cavity 205 may be etched by wet etching processes known in the art, although in other embodiments dry etching may alternatively be utilized to form the cavity 205. After formation of the cavity 205 a passivation film 210, for example, silicon nitride ($Si_3N_4$) or silicon dioxide ($SiO_2$) is deposited over the front surface of the wafer using, for example, a chemical vapor deposition (CVD) process known in the art. The resultant structure (only a portion of which is shown) is illustrated in FIG. 2A.

Figure 2B:
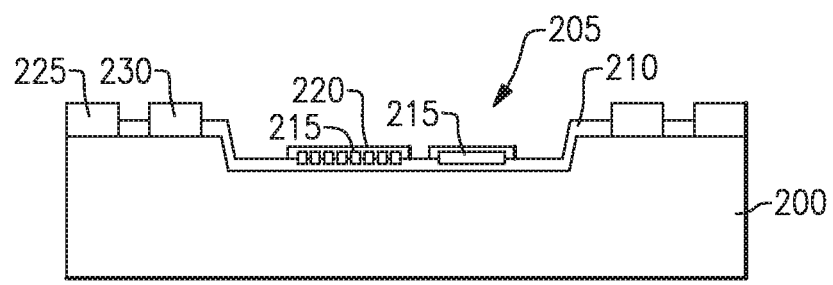
Figure 2C:
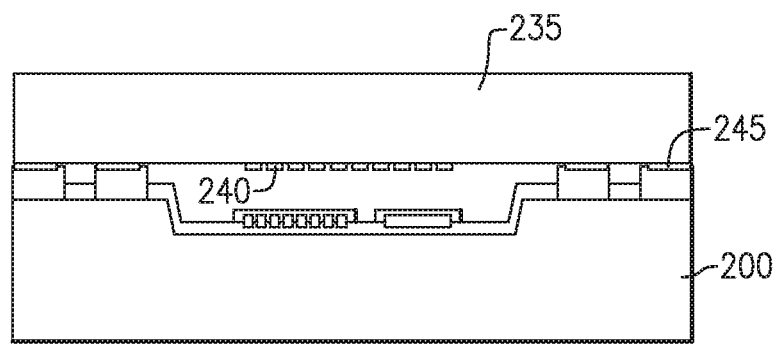

Front side processing of the semiconductor substrate further includes forming one or more passive devices 215, for example, inductors, capacitors, transmission lines, couplers, diodes, etc. within the cavity 205 by, for example, deposition and patterning of a metal film or films. The metal film or films may include one or more of copper, aluminum, gold, or other appropriate materials. A passivation film 220, for example, silicon nitride or silicon dioxide may be deposited over the completed passive devices 215. Prior to, subsequent to, or concurrent with formation of the passive devices 215 a seal ring 225 and bond pads 230 are formed on portions of the front side of the wafer 200 outside of the cavity 215. The seal ring 225 and bond pads 230 may contact the semiconductor material of the wafer 200 or electrical traces formed thereon through the passivation film 210 and may be formed of one or more of copper, aluminum, gold, or other appropriate materials. The bond pads 230 may be electrically connected to one or more of the passive devices 215. The resultant structure is illustrated in FIG. 2B.

In act 110 (FIG. 2C), a piezoelectric substrate 235 (or SAW wafer) on which microelectromechanical device(s) 240, for example, surface acoustic wave (SAW) filters, bulk acoustic wave (BAW) filters, duplexers, etc. were previously formed is bonded to the seal ring 225 and bond pads 230 of the wafer 200 such that the front surface of the piezoelectric substrate 235, including the microelectromechanical devices 240 faces the front or cavity side of the wafer 200. The piezoelectric substrate 235 may be formed of, for example, lithium tantalate ($LiTaO_3$), lithium niobate ($LiNbO_3$), or other piezoelectric materials known in the art for fabrication of microelectromechanical devices such as SAW or BAW filters. The piezoelectric substrate 235 may be bonded to the seal ring 225 and bond pads 230 of the wafer 200 with a low temperature eutectic bonding material 245, for example, solder. Additionally or alternatively, the piezoelectric substrate 235 may be bonded to the seal ring 225 and bond pads 230 of the wafer 200 with materials that form a transient liquid phase (TLP) bond, for example, as described in commonly owned and co-pending U.S. patent application Ser. No. 14/815,098, published as US 2016/0037649 A1 on Feb. 4, 2016.

The seal ring 225 and front surfaces of the piezoelectric substrate 235 and semiconductor wafer 200 may define a sealed cavity including the cavity 205, passive devices 215, and microelectromechanical device(s) 240. The bond pads 230 may be electrically and physically coupled to electrical traces (not shown) on the piezoelectric substrate 235 that are in electrical communication with the microelectromechanical device(s) 240.

Figure 2D:
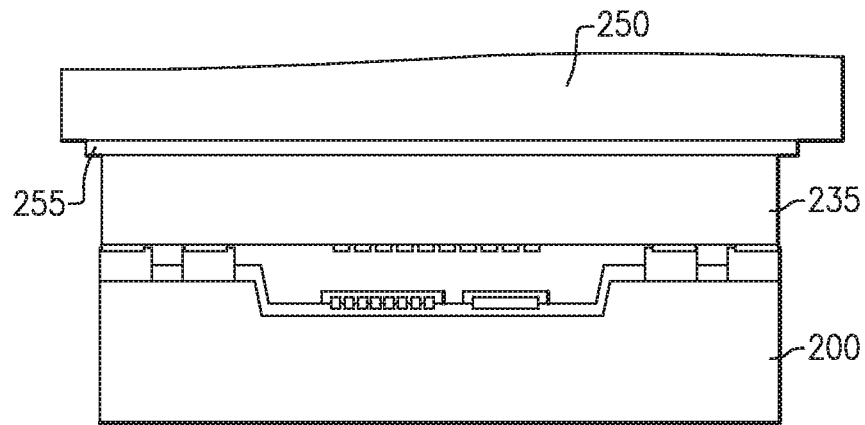

In act 115 backside processing of the semiconductor wafer 200 is performed. As illustrated in FIG. 2D a carrier wafer 250, for example, a sapphire carrier wafer is bonded to the rear side of the piezoelectric substrate 235 (the side opposite the side having the microelectromechanical device(s) 240). The carrier wafer 250 may be bonded to the piezoelectric substrate 235 with a temporary bonding material 255, for example, a Crystalbond™ adhesive. The semiconductor wafer 200 is thinned, for example, by backside grinding or polishing (FIG. 2E) until it reaches a thickness of between about 3 mils and about 4 mils (between about 75 µm to about 102 µm).

Figure 2E:
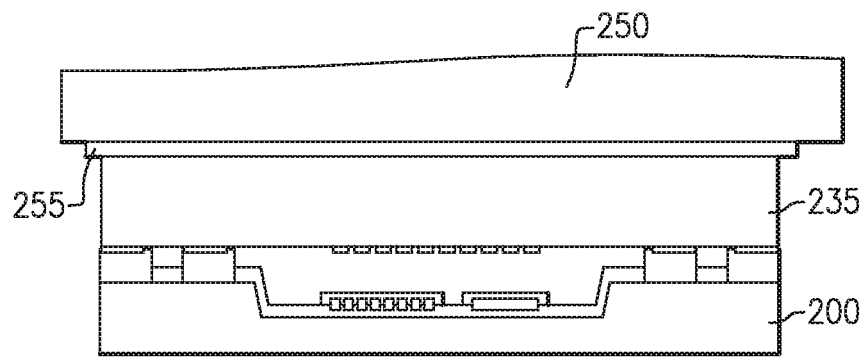
Figure 2F:
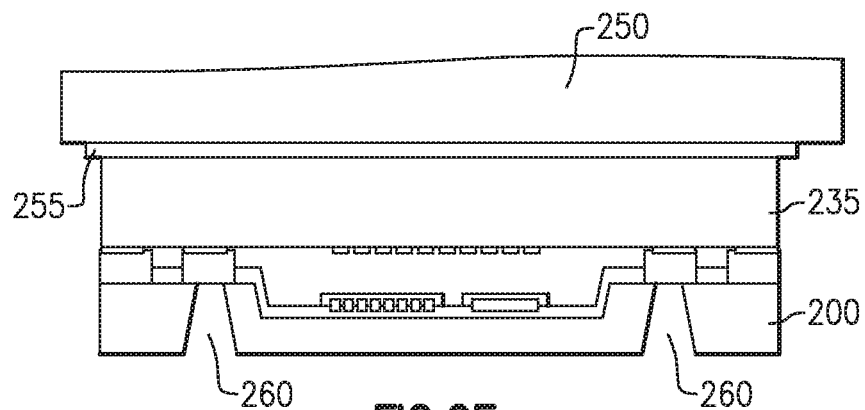
Figure 2G:
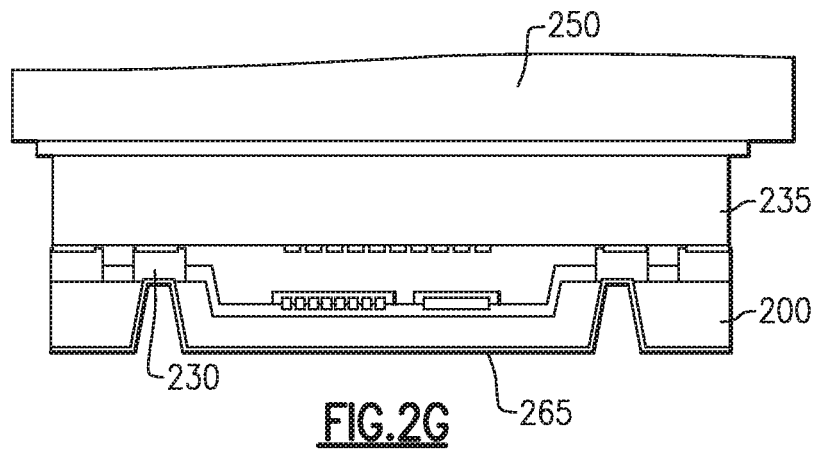
Figure 2H:
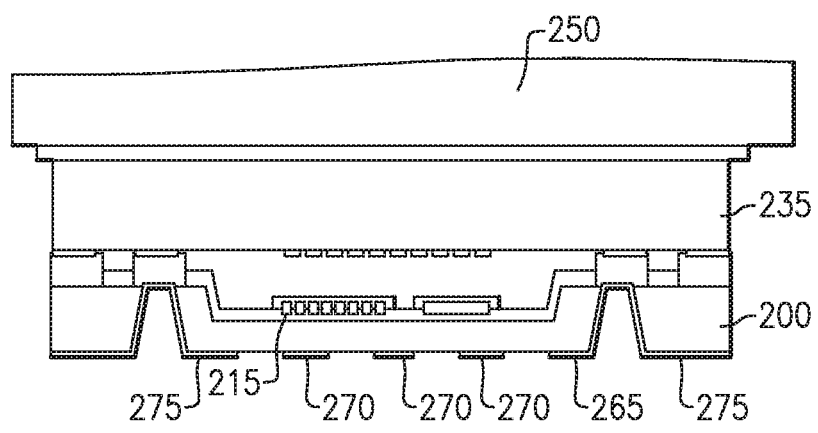
Figure 2I:
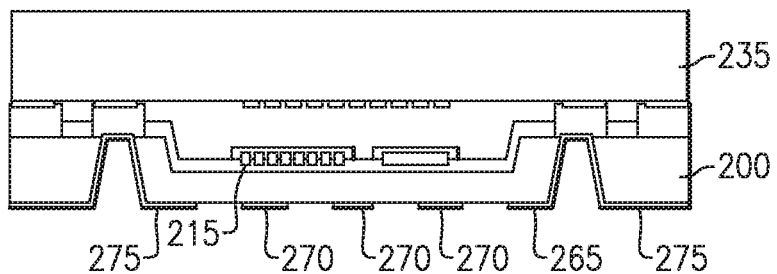

Through-wafer vias (TWVs) 260 are then etched through the rear of the thinned wafer 200 to expose lower surfaces of the bond pads 230 (FIG. 2F). A layer of metal 265, for example, copper or aluminum, is deposited on the rear of the thinned wafer and lower surfaces of the bond pads 230 (FIG. 2G) and then patterned to create passive device bonding pads 270 that are in electrical communication with the passive device(s) 215 through conductors (e.g., TWVs, not shown) extending through the bulk of the semiconductor wafer 200 (FIG. 2H). Portions of the metal layer 265 in electrical contact with the bond pads 230 may extend onto the rear of the wafer 200 to form electrical contacts 275 for the microelectromechanical device(s) 240 on the piezoelectric substrate 235. The carrier wafer 250 is then removed from the rear side of the piezoelectric substrate 235 by, for example, dissolving the temporary bonding material 255 in a solvent, for example, acetone (FIG. 2I).

Figure 2J:
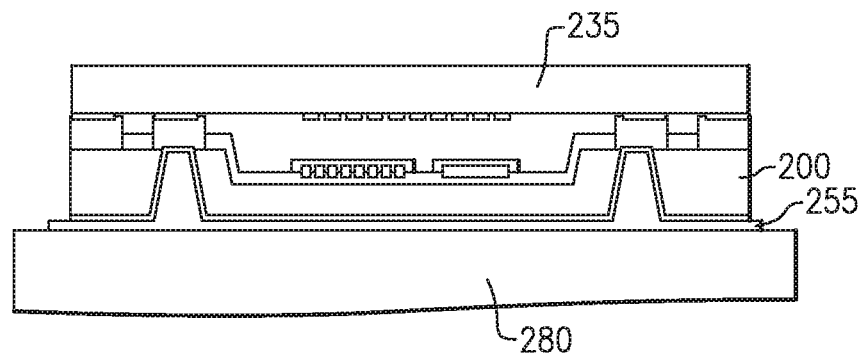
Figure 2K:
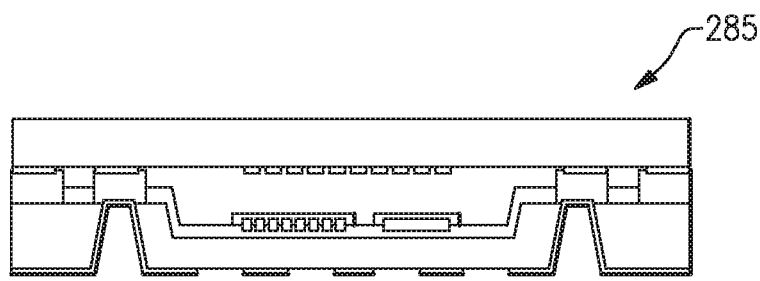

Thinning of the piezoelectric substrate 235 is performed in act 120. A carrier wafer 280, which may be substantially similar or even the same wafer as carrier wafer 250 is bonded to the rear side of the semiconductor wafer with temporary bonding material 255 (FIG. 2J). The piezoelectric substrate 235 is then thinned, for example, by backside grinding or polishing until it is between about 200 µm and about 250 µm thick. The carrier wafer 280 is then removed from the wafer 200, for example, by dissolution of the temporary bonding material 255 in a solvent, for example, acetone (FIG. 2K).

Singulation and mounting of the completed combined semiconductor/piezoelectric substrate package is then performed in act 125. The completed semiconductor/piezoelectric substrate package 285 is separated from other semiconductor/piezoelectric substrate packages 285 on the semiconductor wafer and piezoelectric substrate on which they were formed by tape mounting and singulation by, for example, laser dicing or sawing, and then mounted onto a mounting substrate 290, for example, a printed circuit board by pick and place onto substrate bond pads (not shown) and solder reflow or transient liquid phase bonding. The mounted packages 285 may then be overmolded with a molding compound 295, for example, epoxy for protection from the environment, resulting in the structure illustrated in FIG. 2L.

An advantage of the process described above is that it is fully compatible with existing GaAs heterojunction bipolar transistor (HBT) technology in that it may be performed using the same types of equipment used in existing GaAs HBT fabrication technologies. The metal seal rings 225 may provide a hermetic seal for the cavity 215 and the microelectromechanical device(s) 240 disposed therein. The process provides for fabrication of a SAW or BAW filter or a circuit including same along with passive components to provide filter impedance matching within a single package. Utilization of the carrier wafers 250, 280 provides for the package to be produced while avoiding the need for the handling of thin, fragile wafers. The TWVs 260 provide low impedance and low inductance connections to the microelectromechanical device(s) 240 on the piezoelectric substrate 235. The package 285 may exhibit high mechanical integrity, may be as thin as about 350 µm or less, and may be less expensive to produce than processes involving separately forming semiconductor circuit elements and microelectromechanical device(s) on a corresponding piezoelectric substrate.

Various modifications may be made to the process described above. In one embodiment, backside processing of the semiconductor wafer 200 may be performed prior to bonding of the semiconductor wafer 200 to the piezoelectric substrate 235. This modification is illustrated with reference to the flowchart of FIG. 3 and the diagrams in FIGS. 4A-4D. In this embodiment, the cavity 205, passive components 215, seal ring 225, and bond pads 230 are formed in a similar manner as in the process described above (collectively Semiconductor Wafer Front Side Processing act 305 in FIG. 3). However, instead of bonding the piezoelectric substrate 235 to the semiconductor wafer 200 as in act 110, FIG. 2C, back side processing of the semiconductor wafer 200 is first performed (act 310). A carrier wafer 250 (e.g., a sapphire wafer) may be bonded directly to the front side of the semiconductor wafer 200 with a temporary bonding material 255, for example, a Crystalbond™ adhesive. The semiconductor wafer 200 may then undergo backside processing similar to that described with reference to act 115 of FIG. 1B, FIGS. 2E-2H to thin the semiconductor wafer 200 and form the TWVs 160 and passive device and microelectromechanical device bond pads 270 and 275 (FIG. 4A). The carrier wafer 250 may be removed from the semiconductor wafer (FIG. 4B), for example, by dissolution of the temporary bonding material 255 with a solvent, for example, acetone.

Figure 4A:
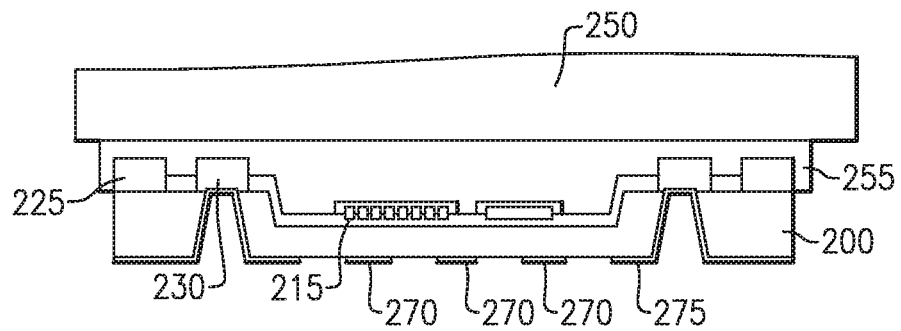
FIGS. 4A-4D illustrate the acts in the method of FIG. 3.
Figure 4B:
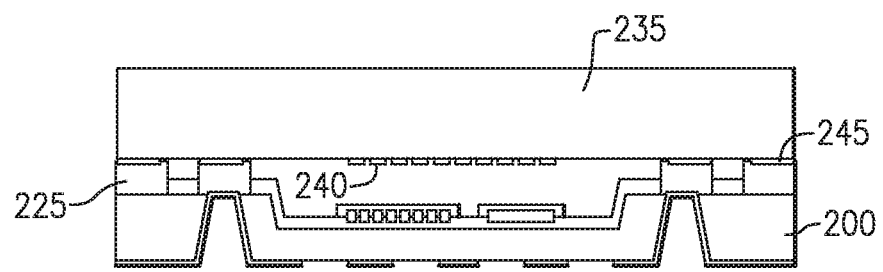
Figure 4C:
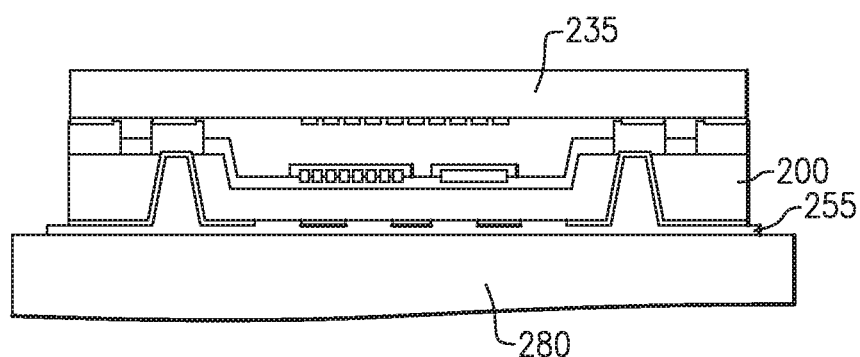
Figure 4D:
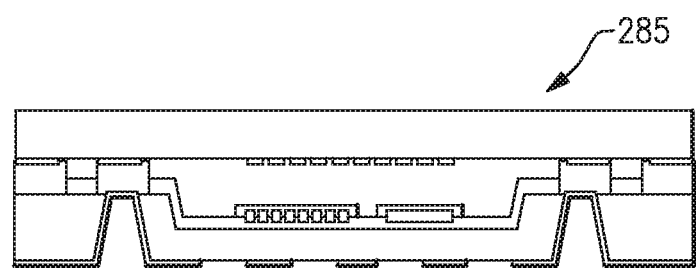

In act 315, which is similar to act 110 in the flowchart of FIG. 1B, a piezoelectric substrate 235 having preformed microelectromechanical system device(s) 240, for example, SAW or BAW filters may be bonded to the seal ring 225 and bond pads 230 of the semiconductor wafer 200 with a low temperature eutectic bonding material 245, for example, solder or TLP bonding materials. Another carrier wafer 280, which may be similar or even the same as carrier wafer 250 is then bonded to the rear side of the semiconductor wafer 200 with a temporary bonding material 255 (FIG. 4C). The piezoelectric substrate 235 may then be thinned, for example by backside grinding or polishing in act 320, which may be similar to act 125 in the flowchart of FIG. 1B. The carrier wafer 280 is then removed from the backside of the semiconductor wafer 200, for example, by dissolution of the temporary bonding material 255 with a solvent, for example, acetone, resulting in the finished package structure 285 (FIG. 4D) that may be separated from other packaging structures on the semiconductor wafer 200 and piezoelectric substrate 235 and mounted to a mounting substrate in act 325 which may be similar to act 125 of the flowchart of FIG. 1B and FIG. 2L.

The embodiment described with reference to the flowchart of FIG. 3 may have the advantage that the impact of backside processing of the semiconductor wafer 200 on the piezoelectric substrate 235, for example, mechanical stresses induced during backside grinding or polishing or high temperatures that may be applied during etch of the TWVs 260, may be minimized.

Figure 5:
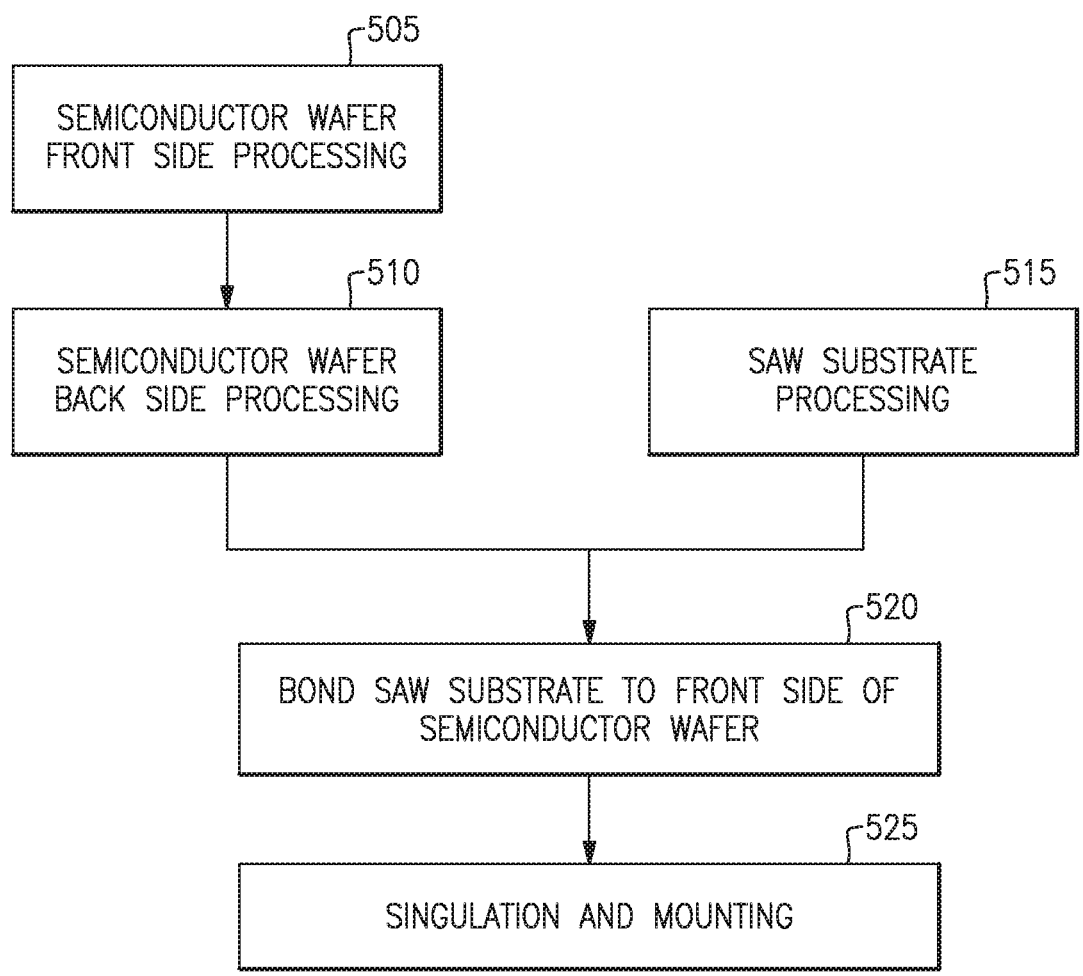
FIG. 5 is a flowchart of a method of fabricating another combined semiconductor/piezoelectric substrate package.
Figure 6A:
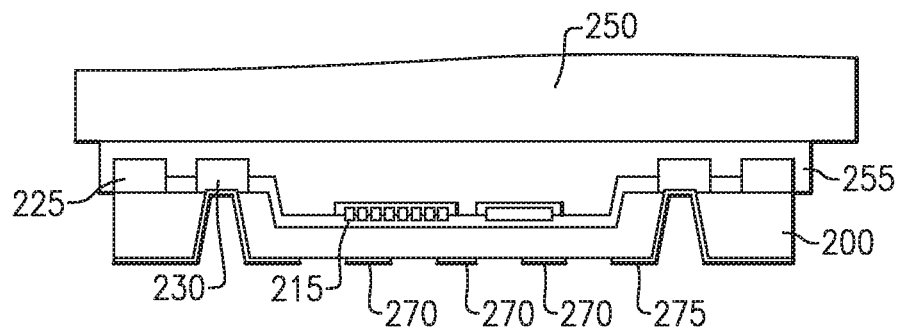
FIGS. 6A-6C illustrate the acts in the method of FIG. 5.
Figure 6B:
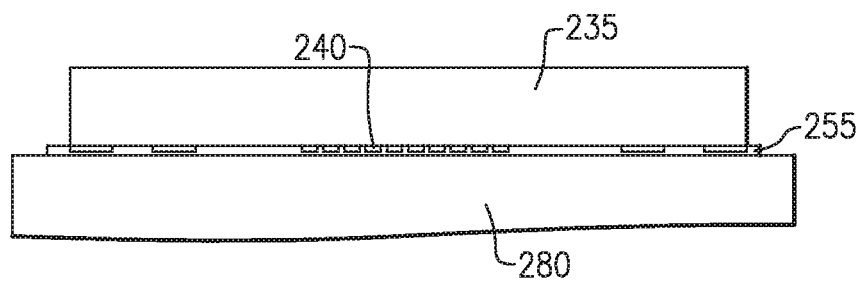
Figure 6C:
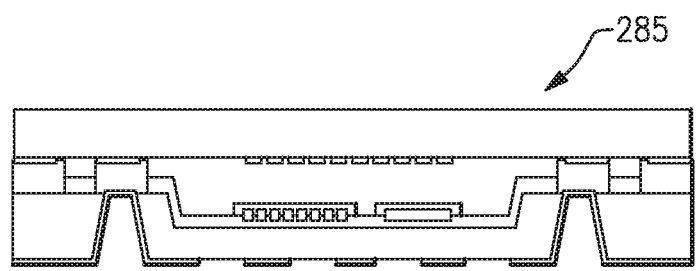

In another embodiment, described in the flowchart of FIG. 5 and the diagrams in FIGS. 6A-6C, the semiconductor wafer 200 and piezoelectric substrate 235 are separately processed and thinned prior to bonding and singulation. In act 505, which may be substantially similar to act 305 of the flowchart of FIG. 3, the cavity 205, passive components 215, seal ring 225, and bond pads 230 are formed on the semiconductor wafer 200. In Semiconductor Wafer Back Side Processing act 510, which may be substantially similar to act 310 of the flowchart of FIG. 3, a carrier wafer 250 (e.g., a sapphire wafer) is bonded directly to the front side of the semiconductor wafer 200 with a temporary bonding material 255, for example, a Crystalbond™ adhesive. The semiconductor wafer 200 then undergoes backside processing similar to that described with reference to FIGS. 2E-2H to thin the semiconductor wafer 200 and form the TWVs 160 and passive device and microelectromechanical device bond pads 270 and 275 (FIG. 6A). The carrier wafer 250 is removed from the semiconductor wafer, for example, by dissolution of the temporary bonding material 255 with a solvent, for example, acetone.

The piezoelectric substrate 235 is separately prepared prior to bonding to the semiconductor wafer 200 (act 515). A carrier wafer 280 (e.g., a sapphire wafer) is bonded directly to the front side of a piezoelectric substrate 325 having preformed microelectromechanical system device(s) 240, for example, SAW or BAW filters with a temporary bonding material 255, for example, a Crystalbond™ adhesive (FIG. 6B). The piezoelectric substrate 235 may then be thinned, for example, by backside grinding or polishing. The carrier wafer 280 is removed from the piezoelectric substrate, for example, by dissolution of the temporary bonding material 255 with a solvent, for example, acetone.

Figure 2L:
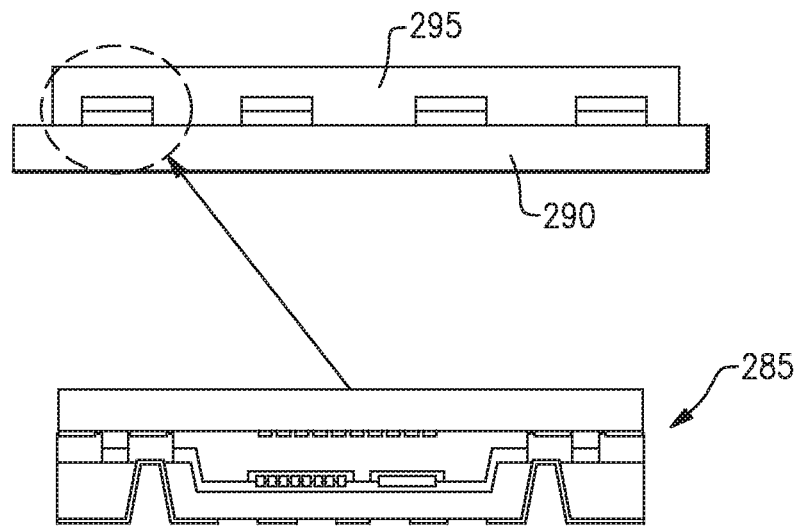
Figure 3:
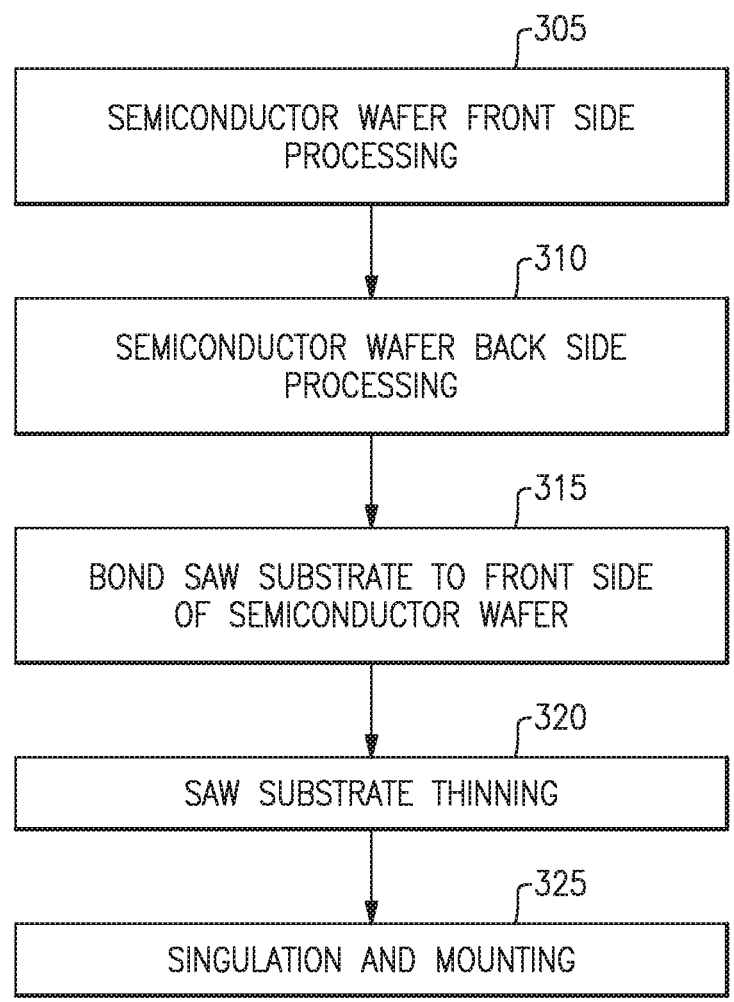
FIG. 3 is a flowchart of a method of fabricating another combined semiconductor/piezoelectric substrate package.

In act 520, which is similar to act 315 in the flowchart of FIG. 3, the piezoelectric substrate 235 is bonded to the seal ring 225 and bond pads 230 of the thinned semiconductor wafer 200 with a low temperature eutectic bonding material 245, for example, solder or TLP bonding material. In act 525, the resulting finished package structure 285 (FIG. 6C) may be separated from other packaging structures on the semiconductor wafer 200 and piezoelectric substrate 235 and mounted to a mounting substrate as described above with reference to act 325 of the flowchart of FIG. 3 and FIG. 2L.

The embodiment described with reference to the flowchart of FIG. 5 may have the advantage that the impact of backside processing of the semiconductor wafer 200 on the piezoelectric substrate 235, for example, mechanical stresses induced during backside grinding or polishing or high temperatures that may be applied during etch of the TWVs 260, may be minimized. Further, mechanical stresses that might otherwise be applied to the semiconductor wafer 200 during backside grinding or polishing of the piezoelectric substrate 235 may also be avoided.

In accordance with another aspect, a combination semiconductor wafer/piezoelectric substrate package may be fabricated in which microelectromechanical elements, for example, SAW or BAW filters disposed on the piezoelectric substrate may be disposed or sealed within a cavity formed on the back side of the semiconductor wafer. An example of this process is described with reference to the flowchart of FIG. 7 and the diagrams of FIGS. 8A-8N.

Figure 8A:
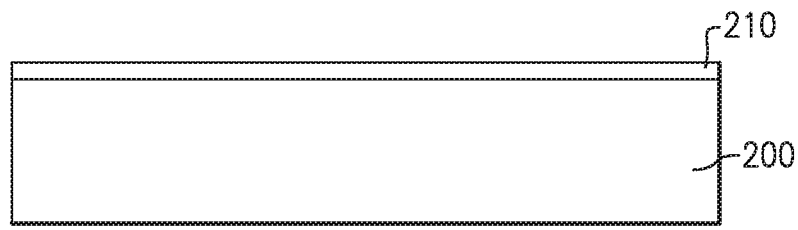
FIGS. 8A-8N illustrate the acts in the method of FIG. 7.
Figure 8B:
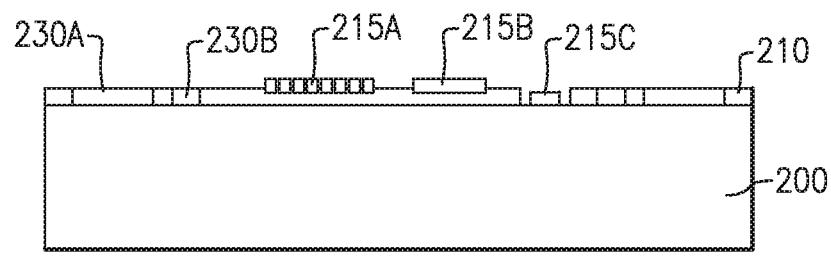
Figure 8C:
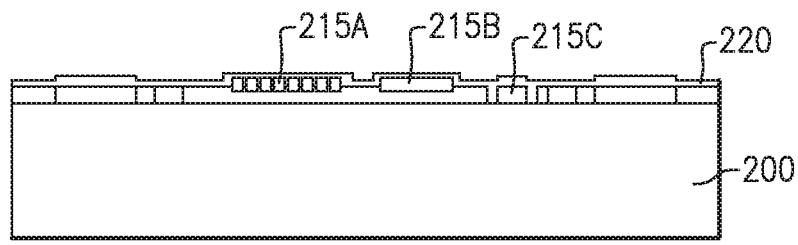
Figure 8D:
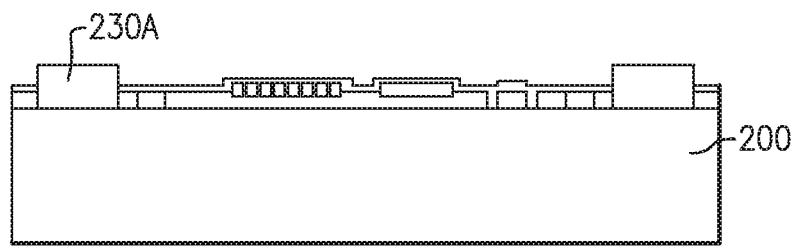

In act 705, front side processing of a semiconductor substrate is performed. As illustrated in FIG. 8A, the front surface of a semiconductor wafer 200 is passivated by deposition of a layer of, for example, silicon nitride 210 (e.g., by CVD). Devices are formed on the front surface of the semiconductor wafer 200 using fabrication methods known in the art. The devices may include passive devices, for example, inductor(s) 215A, capacitor(s) 215B, and/or diodes 215C (FIG. 8B). The passive devices may be utilized in, for example, a matching circuit for filter elements that are provided on the piezoelectric substrate 235 that will be joined to the semiconductor wafer 200. The devices formed on the front side of the semiconductor wafer 200 may also include one or more active devices, for example, one or more transistors (not shown). Bond pads may be fabricated on the front side of the semiconductor wafer 200 concurrently with, or before or after fabrication of the devices. The bond pads may include bond pads 230A that will provide electrical communication with components external to the semiconductor wafer/piezoelectric substrate package and contacts 230B that will provide electrical communication between devices formed on the semiconductor wafer 200 and filter elements that are provided on the piezoelectric substrate 235 that will be joined to the semiconductor wafer 200. Fabrication of the devices on the semiconductor wafer may further include depositing a layer of a passivation film 220, for example, silicon nitride or silicon dioxide over the fabricated devices (FIG. 8C). Fabrication of the bond pads 230A may include exposing upper surfaces of the bond pads 230A or growing the bond pads 230A above the upper surface of the passivation film 220 (FIG. 8D).

Figure 8E:
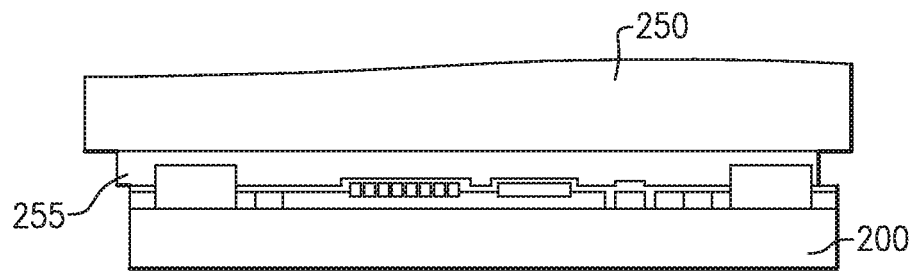
Figure 8F:
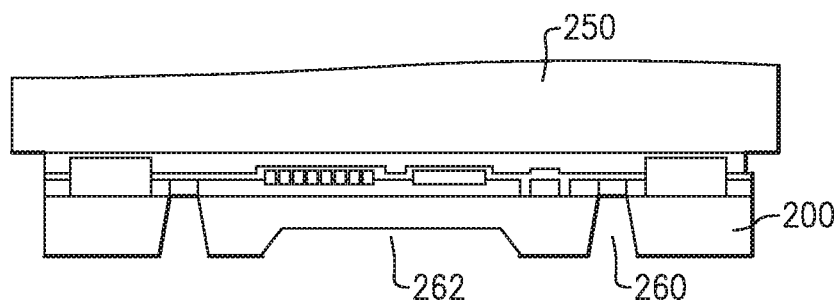

In act 710, back side processing of the semiconductor wafer 200 is performed. A carrier wafer 250, for example, a sapphire wafer is bonded to the front side of the semiconductor wafer 200 with a temporary bonding material 255, for example, a Crystalbond™ adhesive (FIG. 8E). The semiconductor wafer 200 may then undergo a thinning process, for example, backside grinding or polishing to thin the semiconductor wafer 200 to, for example, between about 75 µm and about 100 µm. Through wafer vias 260 are etched (a wet etch or a dry etch or a combination of same) through the back side of the semiconductor wafer 200 to expose lower portions of the contacts 230B. A backside etch (a wet etch or a dry etch or a combination of same) is also performed to form a back side cavity 262 in the back side of the semiconductor wafer (FIG. 8F).

Figure 8G:
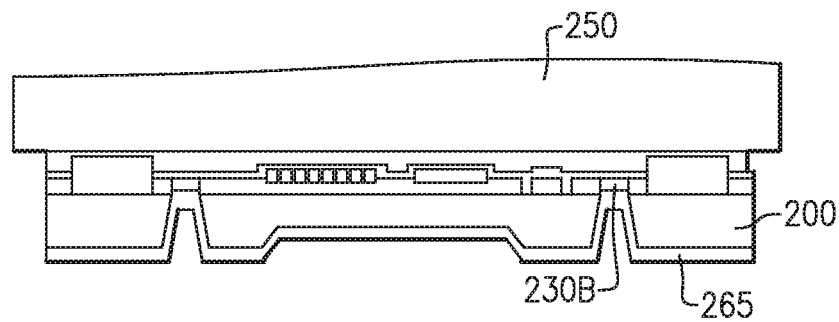
Figure 8H:
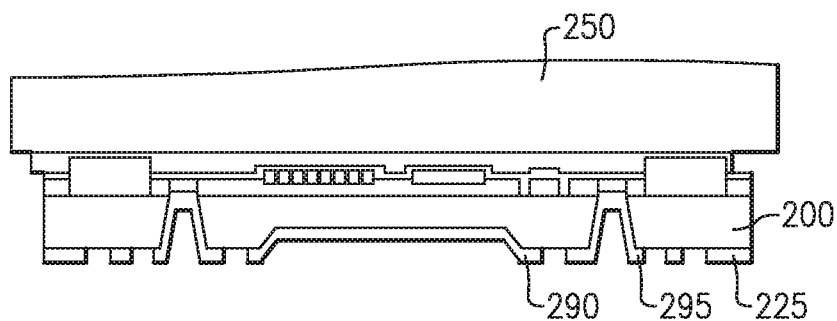
Figure 8I:
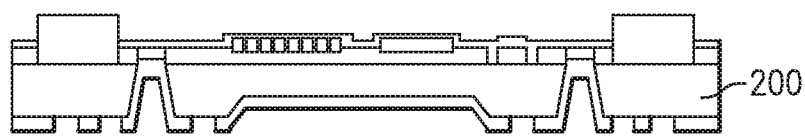

A layer of metal 265, for example, copper, aluminum, or another suitable metal or alloy is deposited on the back surface of the semiconductor wafer 200 and makes electrical contact with the bottom of the contacts 230B (FIG. 8G) and coats the upper and side walls of the cavity 262. The back side metallization 265 is patterned to form electrical contacts 290 for filter elements that are provided on the piezoelectric substrate 235 that will be joined to the semiconductor wafer 200, contacts 295 that provide electrical communication between the filter elements that are provided on the piezoelectric substrate 235 and devices on the semiconductor wafer 200 by way of contacts 230B, and a metal ring 225 (or other closed geometric structure) that will serve as a seal ring to hermetically seal the back side cavity 262 (FIG. 8H). After backside processing of the semiconductor wafer 200, the carrier wafer 250 may be removed (FIG. 8I), for example, by dissolution of the temporary bonding material 255 with a solvent, for example, acetone.

Figure 8J:
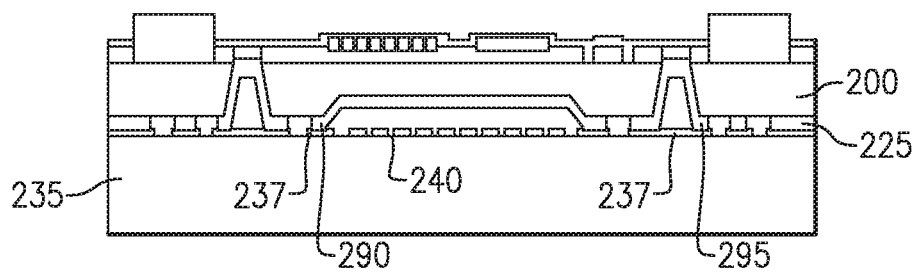

In act 715 a piezoelectric substrate 235 having preformed microelectromechanical system device(s) 240, for example, SAW or BAW filters is bonded to the rear side of the semiconductor wafer 200 (FIG. 8J). Electrical contacts 237 on the top of the piezoelectric substrate 235 that are in electrical communication with the microelectromechanical system device(s) 240 may be electrically and physically bonded to the various contacts 290, 295 on the bottom of the semiconductor wafer 200 with a low temperature eutectic bonding material, for example, solder or TLP bonding material. The seal ring metallization 225 may be bonded to the piezoelectric substrate 235 with a low temperature eutectic bonding material, for example, solder or TLP bonding material and may circumscribe the cavity 262, forming a hermetic seal for the cavity 262 and microelectromechanical system device(s) 240 disposed within the cavity.

Figure 8K:
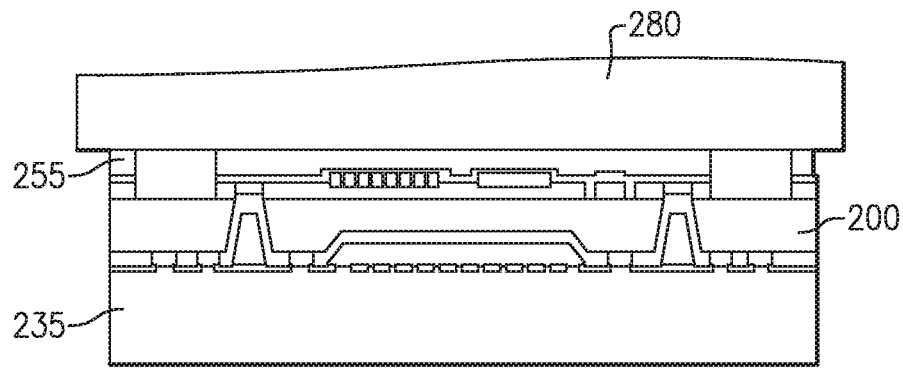
Figure 8L:
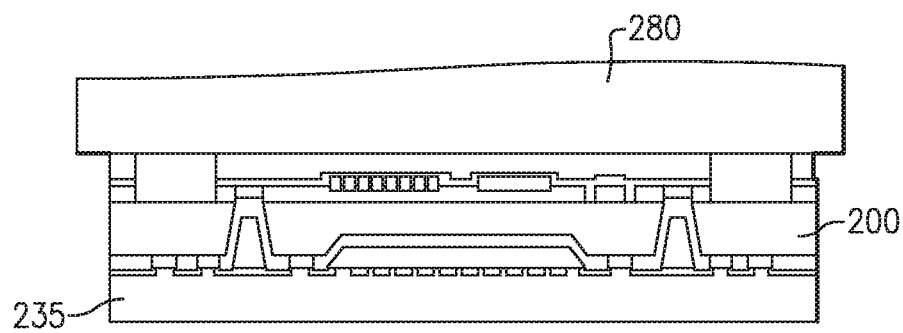

In act 720, the piezoelectric substrate 235 is thinned. A carrier wafer 280, for example, a sapphire wafer is bonded to the front side of the semiconductor wafer 200 with a temporary bonding material 255, for example, a Crystalbond™ adhesive (FIG. 8K). In some embodiments, the carrier wafer 280 may be the carrier wafer 250 if the process allowed for bonding of the piezoelectric substrate 235 to the semiconductor wafer 200 without having to remove the carrier wafer 250. The piezoelectric substrate 235 is then thinned, for example by backside grinding or polishing (FIG. 8L). After thinning of the piezoelectric substrate 235, the carrier wafer 280 may be removed (FIG. 8M), for example, by dissolution of the temporary bonding material 255 with a solvent, for example, acetone.

In act 725, the resulting finished package structure 300 (FIG. 8M) may be separated from other packaging structures on the semiconductor wafer 200 and piezoelectric substrate 235 and mounted to a mounting substrate as described above with reference to act 325 of the flowchart of FIG. 3 and FIG. 2L. In some embodiments, solder balls 230C may be formed on bond pads 230A (FIG. 8N) to facilitate controlled collapse chip connection (C4) solder bonding.

Figure 7:
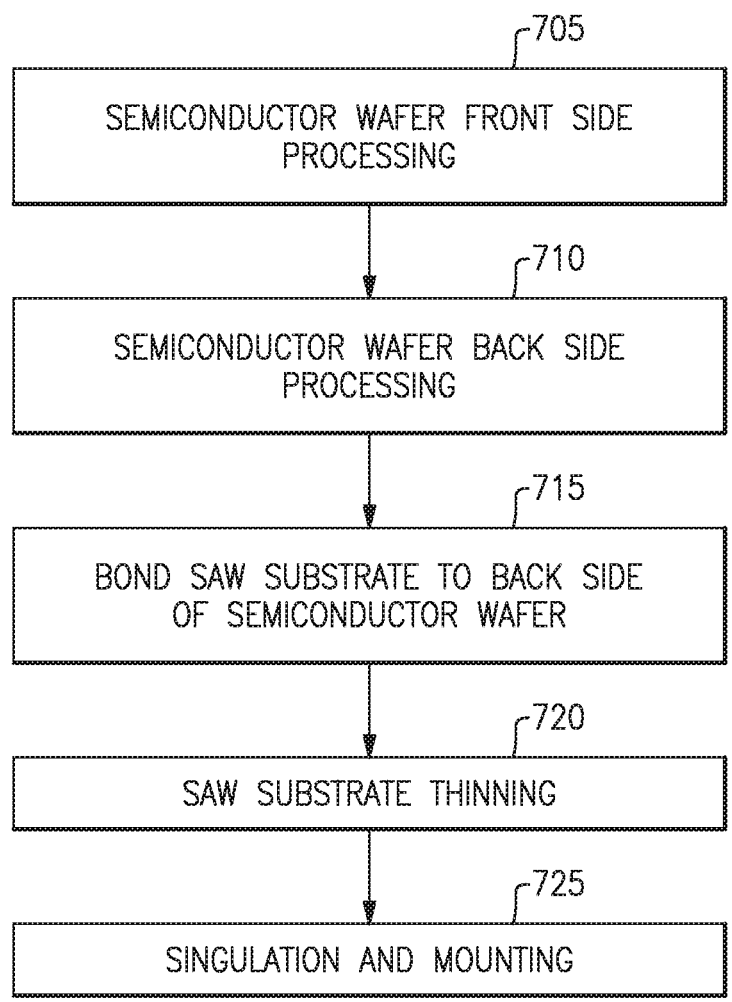
FIG. 7 is a flowchart of a method of fabricating another combined semiconductor/piezoelectric substrate package.

The embodiment described with reference to the flowchart of FIG. 7 may have the advantage of being fully compatible with existing GaAs HBT processing technologies in that it may be performed using the same types of equipment used in existing GaAs HBT fabrication technologies. The microelectromechanical system device(s) 240, for example, SAW or BAW filters may be hermetically sealed within the cavity 262 in the back side of the semiconductor wafer 200 by the seal ring metallization 225. The metallization on the upper and side walls of the cavity 262 may assist in shielding the microelectromechanical system device(s) 240 from electromagnetic interference. The provision of the passive devices on the semiconductor wafer 200 may provide for the fabrication of matching circuitry for the microelectromechanical system device(s) 240 within the same package as the microelectromechanical system device(s) 240. The electrical interconnects through the TWVs may provide low inductance and low impedance connections to the devices formed in the semiconductor wafer 200. The front side of the semiconductor wafer may be bumped (FIG. 8O) with the piezoelectric substrate 235 attached, making the package flip-chip compatible. The package 300 may exhibit high mechanical integrity, may be as thin as about 350 µm or less, and may be less expensive to produce than processes involving separately forming semiconductor circuit elements on a semiconductor substrate and microelectromechanical device(s) on a corresponding piezoelectric substrate.

Various modifications may be made to the embodiment described with reference to the flowchart of FIG. 7. For example, in some variations, the piezoelectric substrate 235 may be bonded to the semiconductor wafer 200 prior to removing the carrier wafer 250 from the semiconductor substrate 200. Solder bumps 230C may be formed on the semiconductor wafer 200 before performing the back side processing of the semiconductor wafer 200. The piezoelectric substrate 235 may be thinned prior to bonding to the semiconductor substrate 200.

Figure 9:
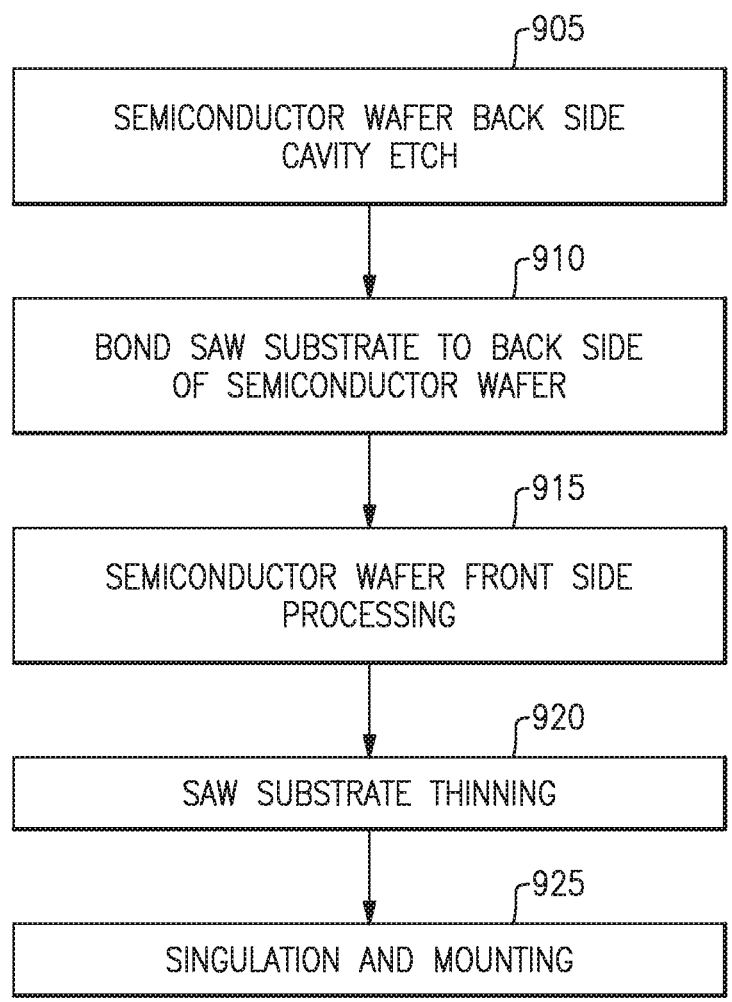
FIG. 9 is a flowchart of a method of fabricating another combined semiconductor/piezoelectric substrate package.

In accordance with another aspect, a combination semiconductor wafer/piezoelectric substrate package may be fabricated in a process involving bonding of the piezoelectric substrate to the semiconductor wafer prior to the formation of devices on the semiconductor wafer. An example of this process is illustrated in the flowchart of FIG. 9 and the images in FIGS. 10A-10M.

Figure 10A:
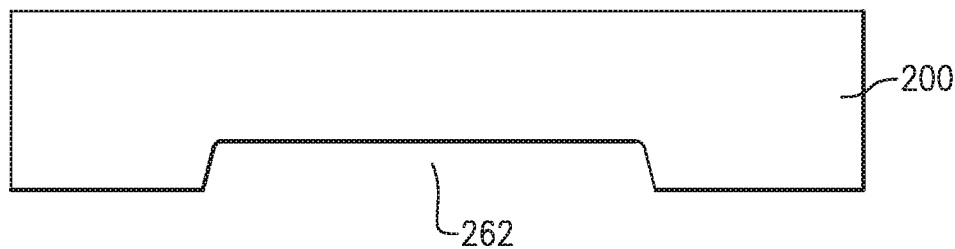
FIGS. 10A-10M illustrate the acts in the method of FIG. 9.
Figure 10B:
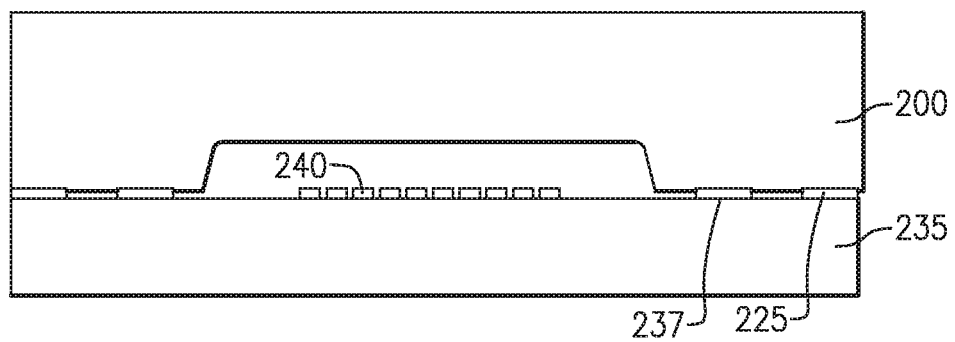

In act 905, FIG. 10A, a semiconductor wafer 200, for example, a GaAs or silicon wafer is etched (wet etch, dry etch, or both) from the back side to form a back side cavity 262. In act 910 a piezoelectric substrate 235 having pre-formed microelectromechanical system device(s) 240, for example, SAW or BAW filters is bonded to the rear side of the semiconductor wafer 200 (FIG. 10B) with the microelectromechanical system device(s) 240 disposed within the back side cavity 262. Electrical contacts 237 on the top of the piezoelectric substrate 235 that are in electrical communication with the microelectromechanical system device(s) 240 may be electrically and physically bonded to the bottom of the semiconductor wafer 200 or electrical contacts or traces formed thereon with a low temperature eutectic bonding material, for example, solder or TLP bonding material. Seal ring metallization 225 which may include a low temperature eutectic bonding material, for example, solder or TLP bonding material may bond the semiconductor wafer 200 to the piezoelectric substrate 235. The seal ring metallization 225 may circumscribe the cavity 262, forming a hermetic seal for the cavity 262 and microelectromechanical system device(s) 240 disposed within the cavity 262.

Figure 10C:
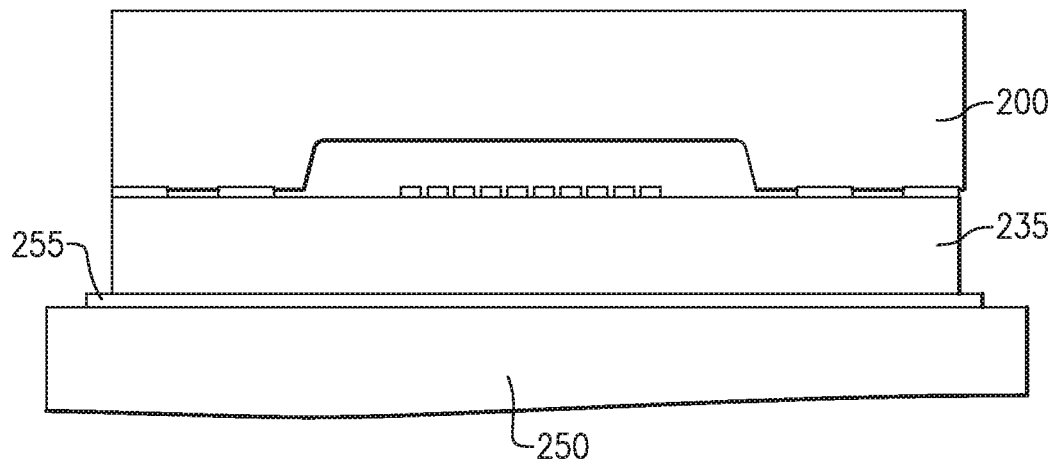
Figure 10D:
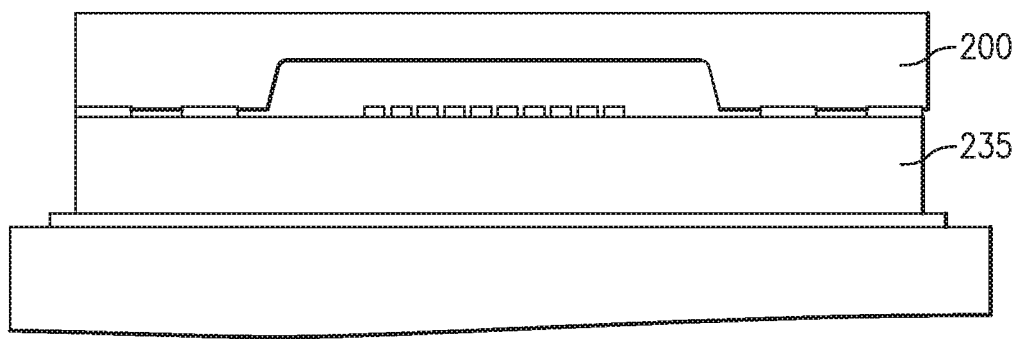
Figure 10E:
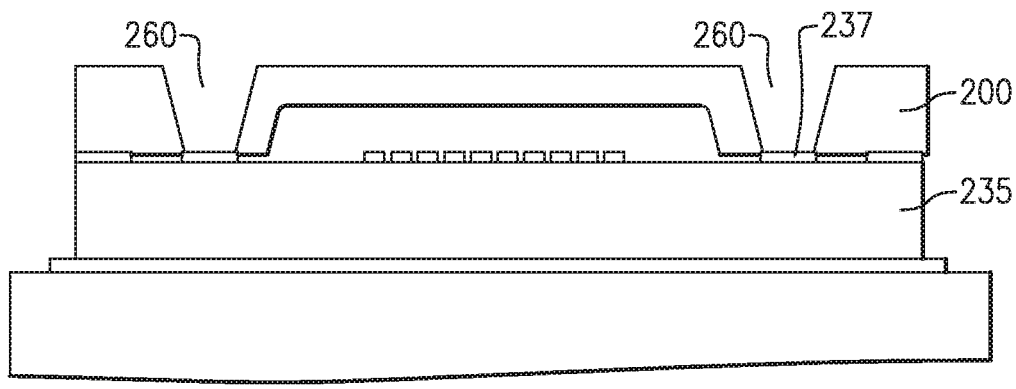

In act 915 front side processing of the semiconductor wafer 200 is performed. A carrier wafer 250, for example, a sapphire wafer is bonded to the rear side of the piezoelectric substrate 235 with a temporary bonding material 255, for example, a Crystalbond™ adhesive (FIG. 10C). The semiconductor wafer 200 may then undergo a thinning process, for example, grinding or polishing (FIG. 10D) from the front side to thin the semiconductor wafer 200 to between about 75 µm and about 100 µm. Through wafer vias 260 are etched (a wet etch or a dry etch or a combination of same) through the front side of the semiconductor wafer 200 to expose upper portions of the contacts 237 (FIG. 10E).

Figure 10F:
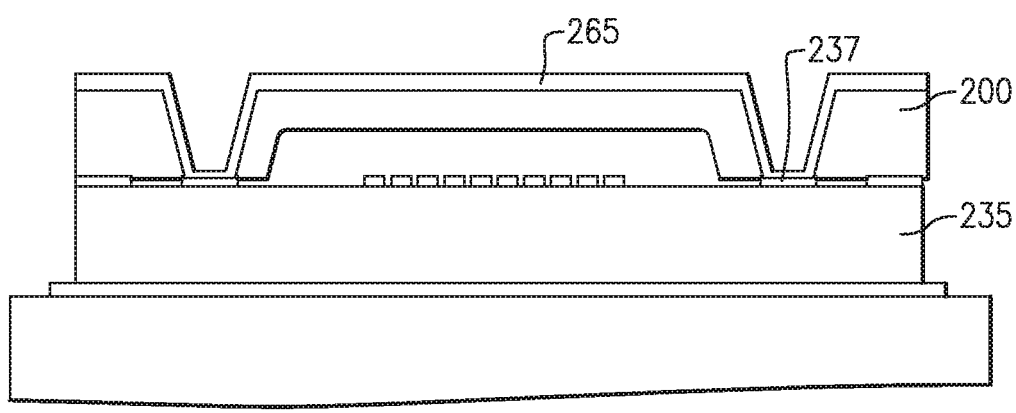
Figure 10G:
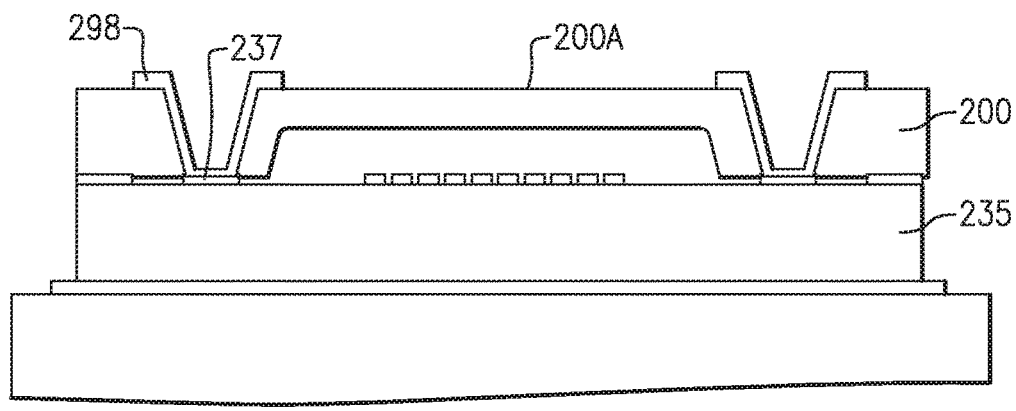
Figure 10H:
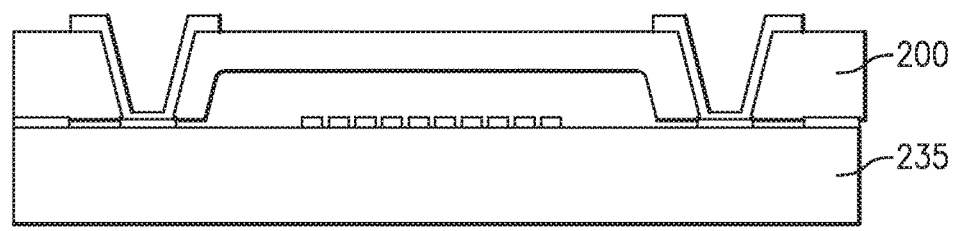

A layer of metal 265, for example, copper, aluminum, or another suitable metal or alloy is deposited on the front surface of the semiconductor wafer 200 and makes electrical contact with the tops of the contacts 237 (FIG. 10F). The front side metallization 265 is patterned to form electrical contacts 298 for filter elements that are provided on the piezoelectric substrate 235 by way of contacts 237. After thinning, metallization, and metallization patterning of the semiconductor wafer 200, the carrier wafer 250 may be removed (FIG. 10H), for example, by dissolution of the temporary bonding material 255 with a solvent, for example, acetone. In other embodiments, the carrier wafer 250 may remain attached to the piezoelectric substrate 235 during the remainder of the front side processing of the semiconductor wafer 200.

Figure 10I:
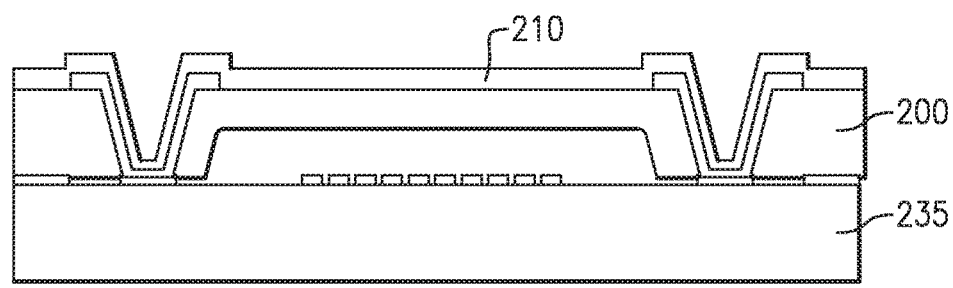
Figure 10J:
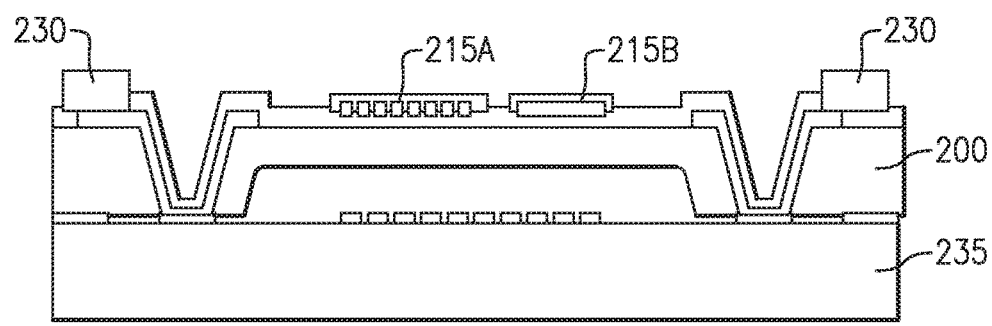

As illustrated in FIG. 10I a layer of passivation material 210, for example, silicon nitride or silicon dioxide is deposited on the front side of the semiconductor wafer 200. Passive devices, for example, inductors 215A and capacitors 215B and/or diodes (not shown) are formed on the layer of passivation material 210 on the front side of the semiconductor wafer 200. Bond pads 230 for providing electrical communication to circuitry outside of the package are also formed on the front side of the semiconductor wafer 200 (FIG. 10J). The bond pads 230 may be formed of copper, aluminum or another suitable metal or alloy and are electrically and physically connected to the electrical contacts 298.

Figure 10K:
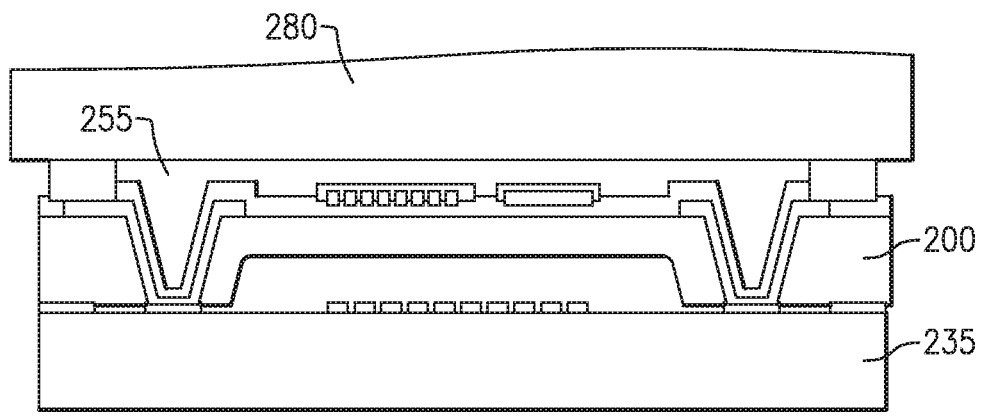
Figure 10L:
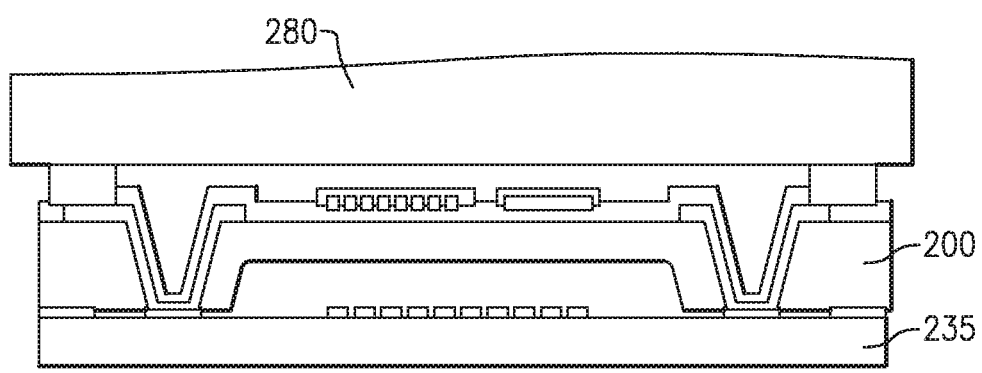
Figure 10M:
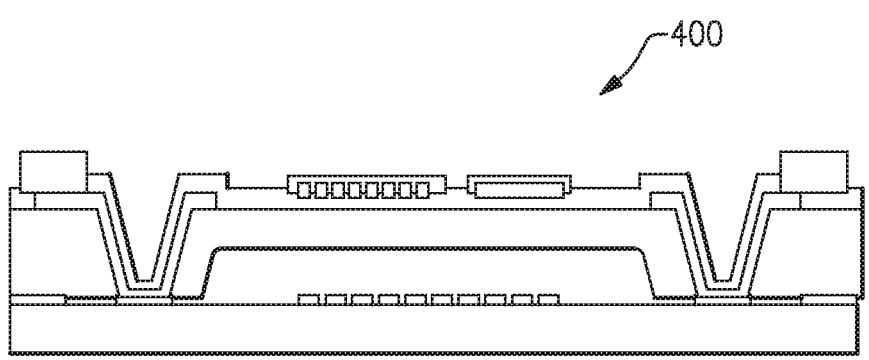

In act 920, the piezoelectric substrate 235 is thinned. A carrier wafer 280, for example, a sapphire wafer is bonded to the front side of the semiconductor wafer 200 with a temporary bonding material 255, for example, a Crystalbond™ adhesive (FIG. 10K). The piezoelectric substrate 235 may then undergo a thinning process, for example, backside grinding or polishing (FIG. 10L). The carrier wafer 280 is then removed from the semiconductor wafer 200, for example, by dissolution of the temporary bonding material 255 with a solvent, for example, acetone. In act 925, the resulting finished package structure 400 (FIG. 10M) may be separated from other packaging structures on the semiconductor wafer 200 and piezoelectric substrate 235 and mounted to a mounting substrate as described above with reference to act 325 of the flowchart of FIG. 3 and FIG. 2L.

Figure 11:
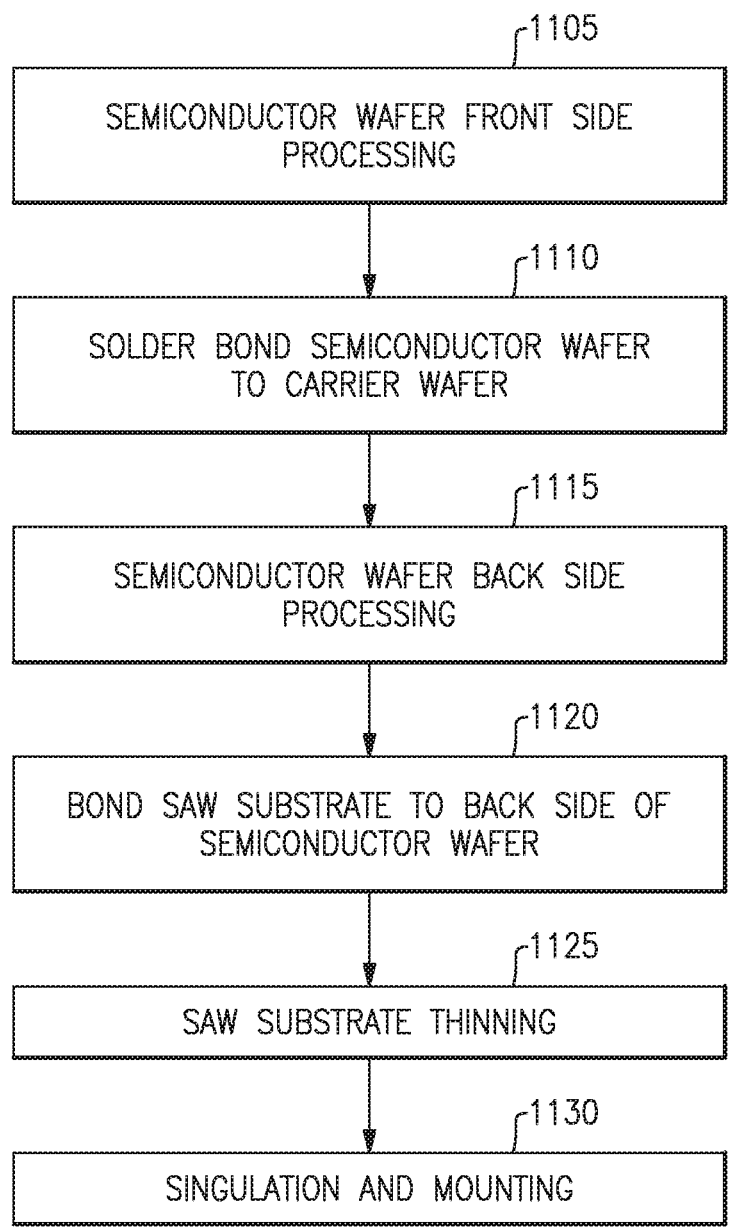
FIG. 11 is a flowchart of a method of fabricating another combined semiconductor/piezoelectric substrate package.

In accordance with another aspect, a combination semiconductor wafer/piezoelectric substrate package may be fabricated in a process involving bonding of the semiconductor wafer to a carrier wafer with solder balls during backside processing of the semiconductor wafer. An example of this process is illustrated in the flowchart of FIG. 11 and the images in FIGS. 12A-12I.

Figure 12A:
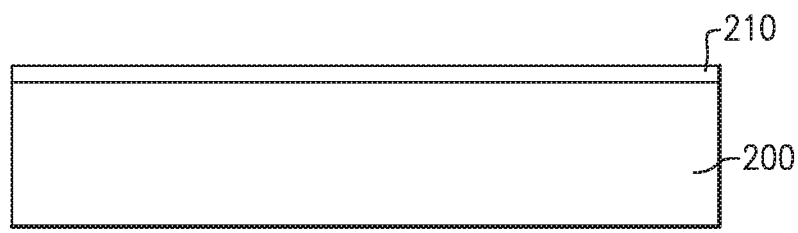
FIGS. 12A-12I illustrate the acts in the method of FIG. 11.
Figure 12B:
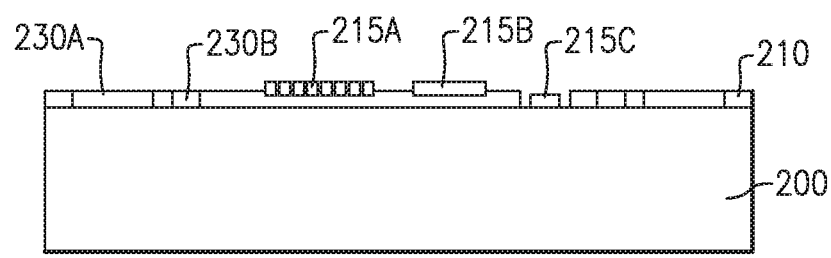
Figure 12C:
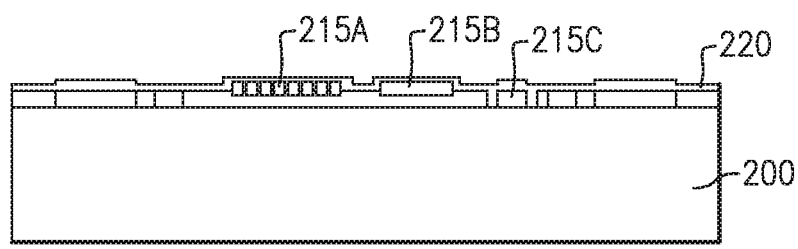

In act 1105, front side processing of a semiconductor substrate is performed. As illustrated in FIG. 12A, the front surface of a semiconductor wafer 200 is passivated by deposition of a layer of, for example, silicon nitride 210 (e.g., by CVD). Devices are formed on the front surface of the semiconductor wafer 200 using fabrication methods known in the art. The devices may include passive devices, for example, inductor(s) 215A, capacitor(s) 215B, and/or diodes 215C (FIG. 12B). The passive devices may be utilized in, for example, a matching circuit for filter elements that are provided on the piezoelectric substrate 235 that will be joined to the semiconductor wafer 200. The devices formed on the front side of the semiconductor wafer 200 may also include one or more active devices, for example, one or more transistors (not shown). Bond pads may be fabricated on the front side of the semiconductor wafer 200 concurrently with, or before or after fabrication of the devices. The bond pads may include bond pads 230A that will provide electrical communication with components external to the semiconductor wafer/piezoelectric substrate package and contacts 230B that will provide electrical communication between devices formed on the semiconductor wafer 200 and filter elements that are provided on the piezoelectric substrate 235 that will be joined to the semiconductor wafer 200. Fabrication of the devices on the semiconductor wafer may further include depositing a layer of a passivation film 220, for example, silicon nitride or silicon dioxide over the fabricated devices (FIG. 12C).

Figure 12D:
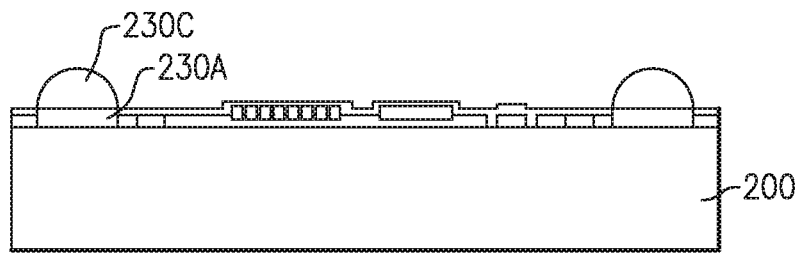

In act 1110, the front side of the semiconductor wafer 200 is solder bonded to a carrier wafer, for example, a sapphire wafer. The bod pads 230A are exposed, for example, by etching of the passivation film 220 over the bond pads 220A and solder balls or bumps 230C are formed on the bond pads 220A (FIG. 12D). A carrier wafer, for example, sapphire wafer 250 is brought into contact with and joined to the solder balls or bumps 230C (FIG. 2E).

Figure 12E:
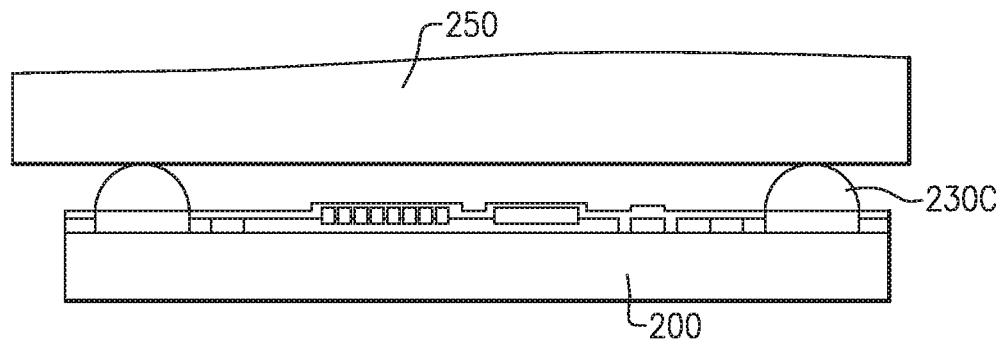
Figure 12F:
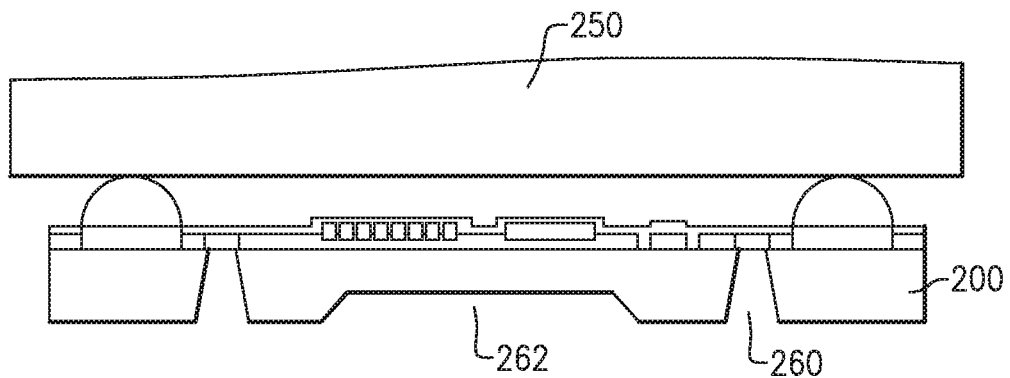
Figure 12G:
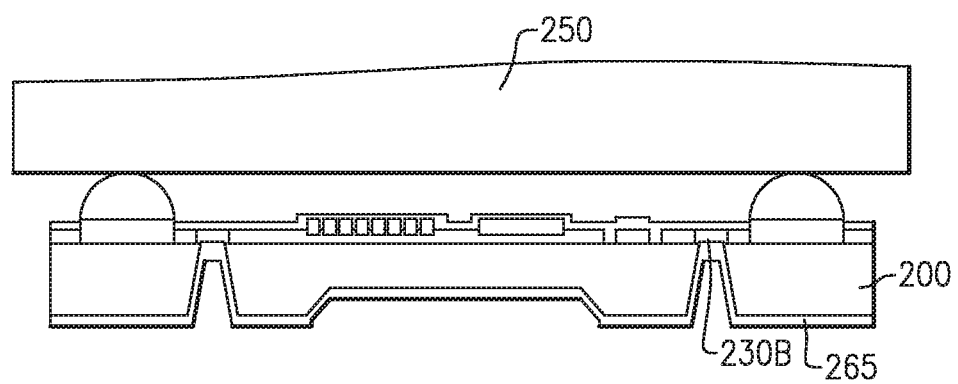

After joining of the carrier wafer to the semiconductor wafer, in act 1115, backside processing of the semiconductor wafer is performed. With the carrier wafer attached, backside grinding or polishing is performed to thin the semiconductor wafer 200, for example, to a thickness of between about 75 μm and about 100 μm (FIG. 12E). Through wafer vias 260 are etched (a wet etch or a dry etch or a combination of same) through the back side of the semiconductor wafer 200 to expose lower portions of the contacts 230B. A backside etch (a wet etch or a dry etch or a combination of same) is also performed to form a back side cavity 262 in the back side of the semiconductor wafer (FIG. 12F).

Figure 12H:
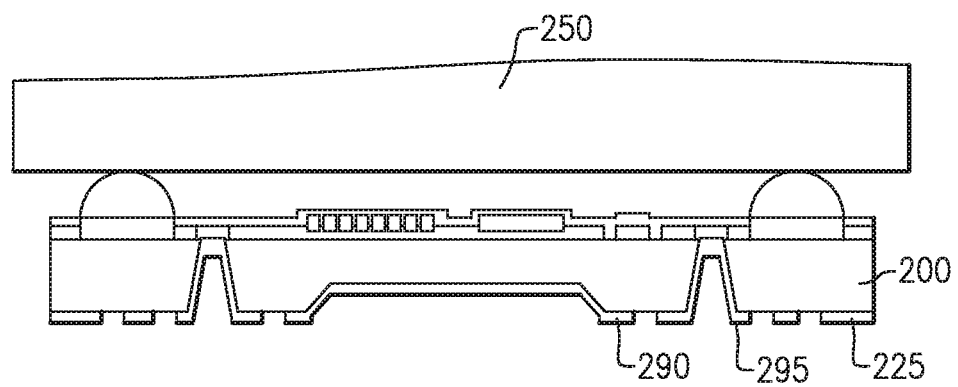

A layer of metal 265, for example, copper, aluminum, or another suitable metal or alloy is deposited on the back surface of the semiconductor wafer 200 and makes electrical contact with the bottom of the contacts 230B (FIG. 12G) and coats the upper and side walls of the cavity 262. The back side metallization 265 is patterned to form electrical contacts 290 for filter elements that are provided on the piezoelectric substrate 235 that will be joined to the semiconductor wafer 200, contacts 295 that provide electrical communication between the filter elements that are provided on the piezoelectric substrate 235 and devices on the semiconductor wafer 200 by way of contacts 230B, and a metal ring 225 (or other closed geometric structure) that will serve as a seal ring to hermetically seal the back side cavity 262 (FIG. 12H). After backside processing of the semiconductor wafer 200, the carrier wafer 250 may be removed (FIG. 12I), for example, by heating of the assembly to at least partially melt the solder bumps 230C to allow separation of the semiconductor wafer 200 from the carrier wafer 250.

Figure 12I:
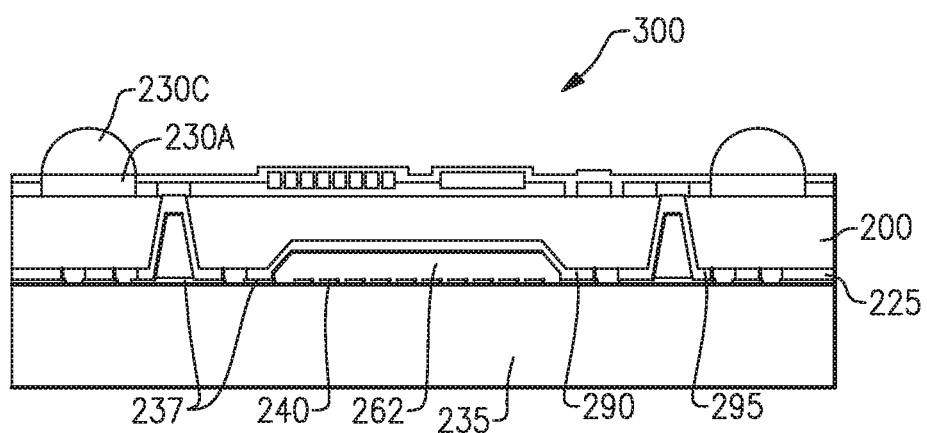

In act 1120 a piezoelectric substrate 235 having preformed microelectromechanical system device(s) 240, for example, SAW or BAW filters is bonded to the rear side of the semiconductor wafer 200 (FIG. 12I). Electrical contacts 237 on the top of the piezoelectric substrate 235 that are in electrical communication with the microelectromechanical system device(s) 240 may be electrically and physically bonded to the various contacts 290, 295 on the bottom of the semiconductor wafer 200 with a low temperature eutectic bonding material, for example, solder or TLP bonding material. The seal ring metallization 225 may be bonded to the piezoelectric substrate 235 with a low temperature eutectic bonding material, for example, solder or TLP bonding material and may circumscribe the cavity 262, forming a hermetic seal for the cavity 262 and microelectromechanical system device(s) 240 disposed within the cavity.

Figure 8M:
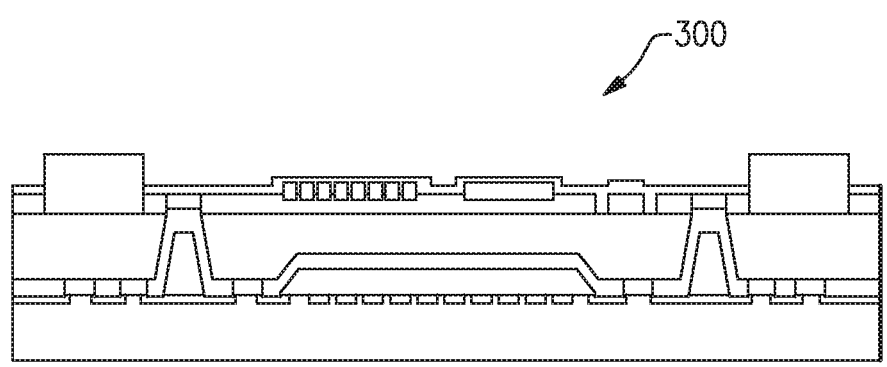
Figure 8N:
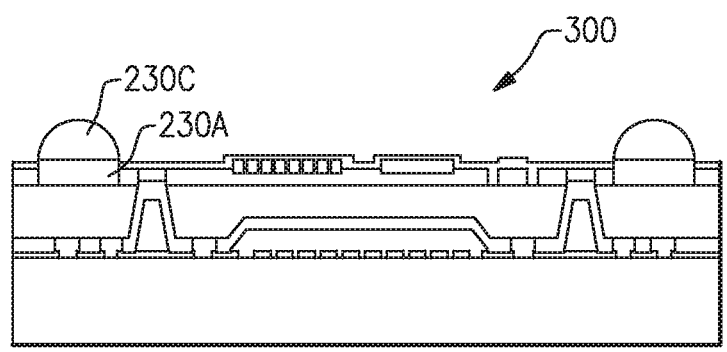

In act 1125, the piezoelectric substrate 235 may optionally be thinned, for example, in accordance with the methods described with reference to FIGS. 8K-8M above. In some embodiments, the carrier wafer 250 is left attached to the semiconductor wafer 200 via the solder bumps 230C until after thinning of the piezoelectric substrate 235. In act 1130, the resulting finished package structure 300 (FIG. 12I) may be separated from other packaging structures on the semiconductor wafer 200 and piezoelectric substrate 235 and mounted to a mounting substrate, for example, using solder balls 230C on bond pads 230A to facilitate C4 solder bonding.

The embodiment described with reference to the flowchart of FIG. 11 may have the advantage of being fully compatible with existing GaAs HBT processing technologies in that it may be performed using the same types of equipment used in existing GaAs HBT fabrication technologies. The microelectromechanical system device(s) 240, for example, SAW or BAW filters may be hermetically sealed within the cavity 262 in the back side of the semiconductor wafer 200 by the seal ring metallization 225. The metallization on the upper and side walls of the cavity 262 may assist in shielding the microelectromechanical system device(s) 240 from electromagnetic interference. The provision of the passive devices on the semiconductor wafer 200 may provide for the fabrication of matching circuitry for the microelectromechanical system device(s) 240 within the same package as the microelectromechanical system device(s) 240. The electrical interconnects through the TWVs may provide low inductance and low impedance connections to the devices formed in the semiconductor wafer 200. The package 300 may exhibit high mechanical integrity, may be as thin as about 350 μm or less, and may be less expensive to produce than packages formed in processes involving separately forming semiconductor circuit elements on a semiconductor substrate and microelectromechanical device(s) on a corresponding piezoelectric substrate.

Figure 13:
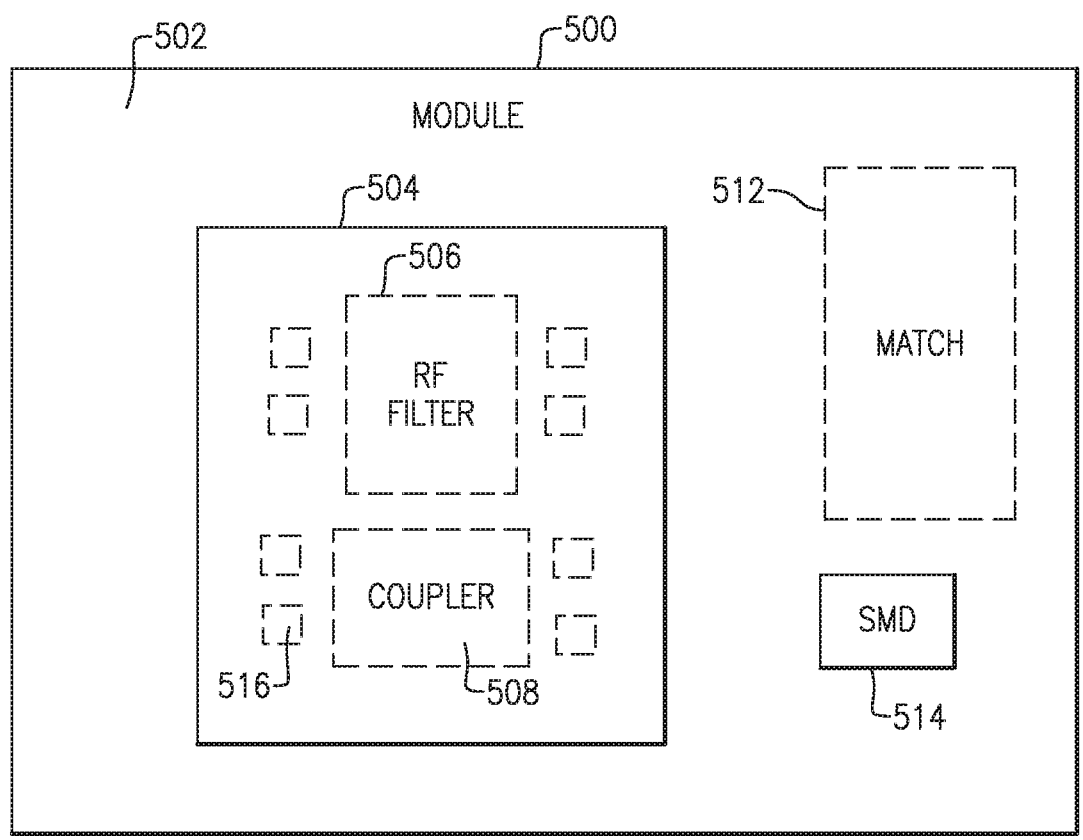
FIG. 13 illustrates an example of an electronics module.

Embodiments described herein can be implemented in a variety of different modules including, for example, a front-end module, an impedance matching module, an antenna tuning module, an antenna switch module, or the like. FIG. 13 illustrates one example of a module 500 that can include any of the embodiments or examples of the combination semiconductor wafer/piezoelectric substrate package disclosed herein. Module 500 has a packaging substrate 502 that is configured to receive a plurality of components, for example, combination semiconductor wafer/piezoelectric substrate package 504, which may be any of the embodiments of combination semiconductor wafer/piezoelectric substrate packages disclosed herein. In some embodiments, the combination semiconductor wafer/piezoelectric substrate package 504 can include an RF filter circuit 506, for example, a SAW or BAW filter and a coupler 508, or other RF components or circuitry or passive devices known in the art. A plurality of connection pads 516, for example, solder or gold bumps or posts can facilitate electrical connections to bond pads (not shown) on the substrate 502 to facilitate passing of power and various signals to and from the combination semiconductor wafer/piezoelectric substrate package 504.

In some embodiments, other components can be mounted on or formed on the packaging substrate 502. For example, one or more surface mount devices (SMD) 514 and one or more matching networks 512 can be implemented. In some embodiments, the packaging substrate 502 can include a laminate substrate.

In some embodiments, the module 500 can also include one or more packaging structures to, for example, provide protection and facilitate easier handling of the module 500. Such a packaging structure can include overmold material formed over the packaging substrate 502 and dimensioned to substantially encapsulate the various circuits and components thereon, for example, combination semiconductor wafer/piezoelectric substrate package 504.

Embodiments of the module 500 may be advantageously used in a variety of electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a telephone, a television, a computer monitor, a computer, a modem, a hand held computer, a laptop computer, a tablet computer, an electronic book reader, a wearable computer such as a smart watch, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a washer, a dryer, a washer/dryer, a peripheral device, a wrist watch, a clock, etc. Further, the electronic devices can include unfinished products.

Figure 14:
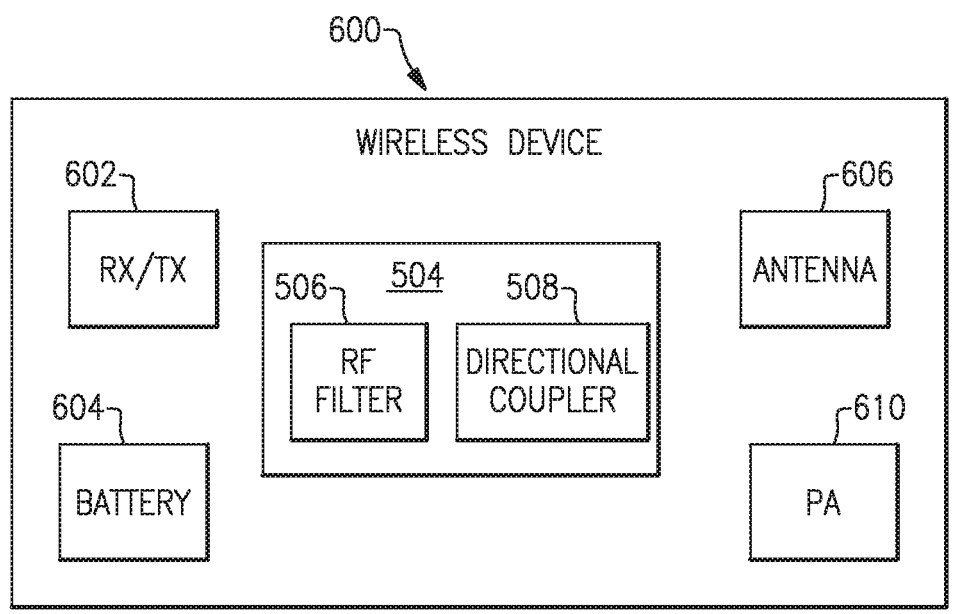
FIG. 14 illustrates an example of a wireless device.

FIG. 14 is a block diagram of a wireless device 600 including a flip-chip mounted combination semiconductor wafer/piezoelectric substrate package 504 according to certain embodiments. The wireless device 600 can be a cellular phone, smart phone, tablet, modem, communication network or any other portable or non-portable device configured for voice and/or data communication. The wireless device 600 includes an antenna 606 that receives and transmits RF signals, an RF filter circuit 506, a power amplifier (PA) 610, and a coupler 508 that can use a transmitted signal for analysis purposes or to adjust subsequent transmissions. For example, the coupler 508 can measure a transmitted RF power signal from the power amplifier (PA) 610, which amplifies signals from a transceiver 602. Coupler 508 and RF filter circuit 506 may be included in a combination semiconductor wafer/piezoelectric substrate package 504. The transceiver 602 can be configured to receive and transmit signals in a known fashion. As will be appreciated by those skilled in the art, the power amplifier 610 can be a power amplifier module including one or more power amplifiers. The wireless device 600 can further include a battery 604 to provide operating power to the various electronic components in the wireless device.

Figure 15:
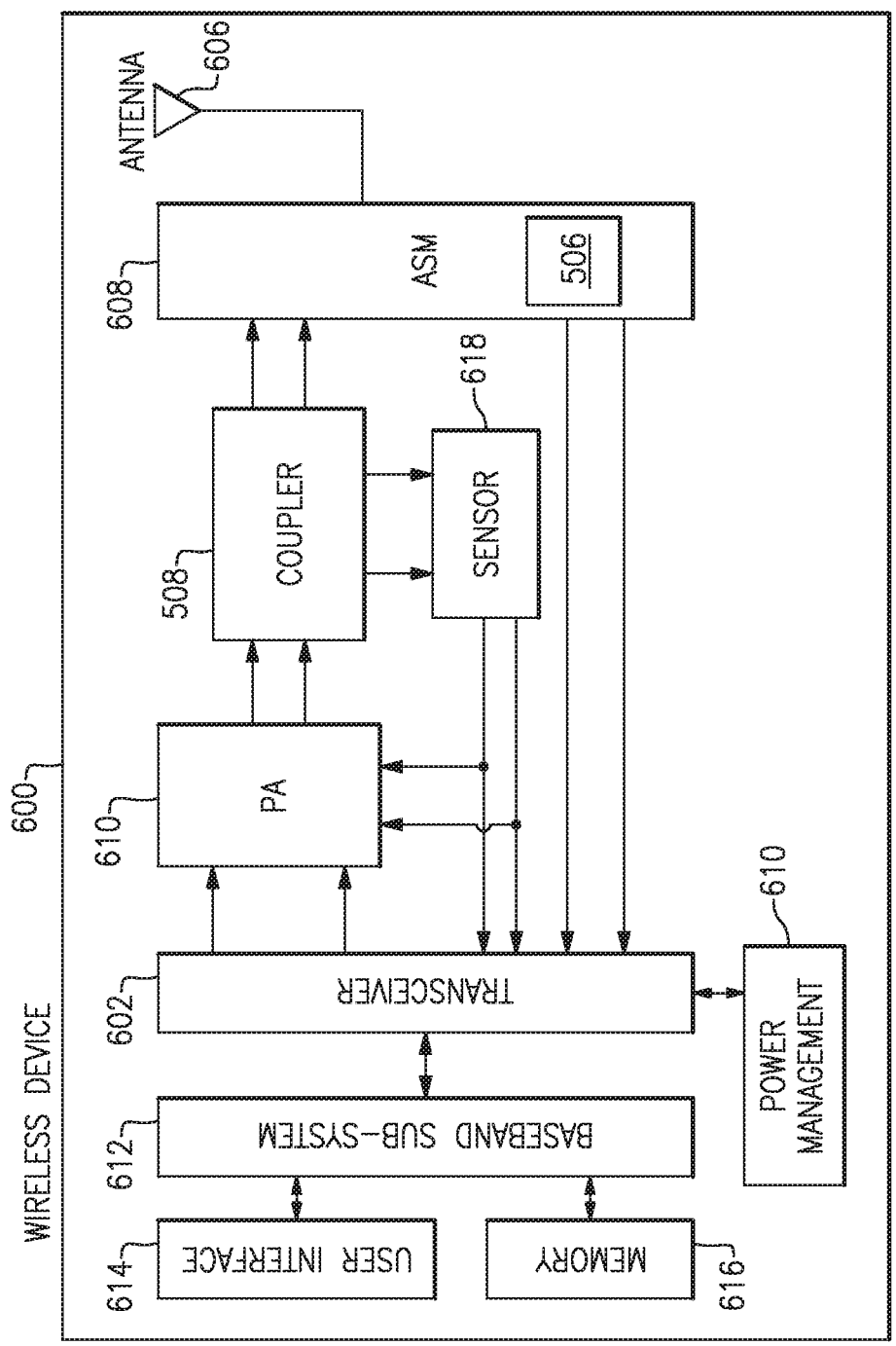
FIG. 15 is a more detailed illustration of the wireless device of FIG. 14.

FIG. 15 is a more detailed block diagram of an example of the wireless device 600. As shown, the wireless device 600 can receive and transmit signals from the antenna 606. The transceiver 602 is configured to generate signals for transmission and/or to process received signals. Signals generated for transmission are received by the power amplifier (PA) 610, which amplifies the generated signals from the transceiver 602. In some embodiments, transmission and reception functionalities can be implemented in separate components (e.g. a transmit module and a receiving module), or be implemented in the same module. The antenna switch module 608 (which may include the RF filter circuit 506) can be configured to switch between different bands and/or modes, transmit and receive modes, etc. As is also shown in FIG. 15, the antenna 606 both receives signals that are provided to the transceiver 602 via the antenna switch module 608 and also transmits signals from the wireless device 600 via the transceiver 602, the PA 610, the coupler 508, and the antenna switch module 608. However, in other examples multiple antennas can be used.

The wireless device 600 of FIG. 15 further includes a power management system 610 that is connected to the transceiver 602 that manages the power for the operation of the wireless device. The power management system 610 can also control the operation of a baseband sub-system 612 and other components of the wireless device 600. The power management system 610 provides power to the wireless device 600 via the battery 604 (FIG. 14) in a known manner, and includes one or more processors or controllers that can control the transmission of signals and can also configure the coupler 508 based upon the frequency of the signals being transmitted, for example.

In one embodiment, the baseband sub-system 612 is connected to a user interface 614 to facilitate various input and output of voice and/or data provided to and received from the user. The baseband sub-system 612 can also be connected to memory 616 that is configured to store data and/or instructions to facilitate the operation of the wireless device, and/or to provide storage of information for the user.

The power amplifier 610 can be used to amplify a wide variety of RF or other frequency-band transmission signals. For example, the power amplifier 610 can receive an enable signal that can be used to pulse the output of the power amplifier to aid in transmitting a wireless local area network (WLAN) signal or any other suitable pulsed signal. The power amplifier 610 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the power amplifier 610 and associated components including switches and the like can be fabricated on GaAs substrates using, for example, pHEMT or BiFET transistors, or on a silicon or SOI substrate using CMOS transistors.

Still referring to FIG. 15, the wireless device 600 can also include a coupler 508 having one or more directional EM couplers for measuring transmitted power signals from the power amplifier 610 and for providing one or more coupled signals to a sensor module 618. The sensor module 618 can in turn send information to the transceiver 602 and/or directly to the power amplifier 610 as feedback for making adjustments to regulate the power level of the power amplifier 610. In this way the coupler 508 can be used to boost/decrease the power of a transmission signal having a relatively low/high power. It will be appreciated, however, that the coupler 508 can be used in a variety of other implementations.

In certain embodiments in which the wireless device 600 is a mobile phone having a time division multiple access (TDMA) architecture, the coupler 508 can advantageously provide feedback to manage the amplification of an RF transmitted power signal from the power amplifier 610. In a mobile phone having a time division multiple access (TDMA) architecture, such as those found in Global System for Mobile Communications (GSM), code division multiple access (CDMA), and wideband code division multiple access (W-CDMA) systems, the power amplifier 610 can be used to shift power envelopes up and down within prescribed limits of power versus time. For instance, a particular mobile phone can be assigned a transmission time slot for a particular frequency channel. In this case the power amplifier 610 can be employed to aid in regulating the power level of one or more RF power signals over time, so as to prevent signal interference from transmission during an assigned receive time slot and to reduce power consumption. In such systems, the coupler 508 can be used to measure the power of a power amplifier output signal to aid in controlling the power amplifier 610, as discussed above. The implementation shown in FIG. 15 is exemplary and non-limiting. For example, the implementation of FIG. 15 illustrates the coupler 508 being used in conjunction with a transmission of an RF signal, however, it will be appreciated that coupler 508 can also be used with received RF or other signals as well.

Having thus described several aspects of at least one embodiment of this invention, it is to be appreciated various alterations, modifications, and improvements will readily occur to those skilled in the art. Any feature described in any embodiment may be included in or substituted for any feature of any other embodiment. Such alterations, modifications, and improvements are intended to be part of this disclosure, and are intended to be within the scope of the invention. Accordingly, the foregoing description and drawings are by way of example only.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items covers all of the following interpretations of the word: any of the items in the list, all of the items in the list, and any combination of the items in the list.

Directional terms such as "above," below," "left," "right," etc. are used herein as a matter of convenience for referencing various surfaces and orientations of features disclosed herein. There directional terms do not imply that the aspects and embodiments disclosed herein are necessarily oriented in any particular orientation. Any dimensions provided in the above disclosure are meant as examples only and are not intended to be limiting.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while acts of the disclosed processes are presented in a given order, alternative embodiments may perform routines having acts performed in a different order, and some processes or acts may be deleted, moved, added, subdivided, combined, and/or modified. Each of these processes or acts may be implemented in a variety of different ways. Also, while processes or acts are at times shown as being performed in series, these processes or acts may instead be performed in parallel, or may be performed at different times.

The teachings of the invention provided herein can be applied to other systems, not necessarily the system described above. The elements and acts of the various embodiments described above can be combined to provide further embodiments.

What is claimed is:

1. A method of fabricating an electronics package, the method comprising:
   forming a cavity in a first surface of a semiconductor substrate;
   forming a passivation layer including one of silicon dioxide or silicon nitride on one of the first surface of the semiconductor substrate or a second surface of the semiconductor substrate opposite the first surface;
   forming one or more passive devices on the passivation layer;
   forming a microelectromechanical device on a piezoelectric substrate; and
   bonding the semiconductor substrate to the piezoelectric substrate with the microelectromechanical device disposed within the cavity.

2. The method of claim 1 wherein the one or more passive devices are formed within the cavity.

3. The method of claim 1 wherein the one or more passive devices are formed on the passivation layer on the second surface of the semiconductor substrate.

4. The method of claim 3 further comprising forming bond pads for connection to a mounting substrate on the second surface of the semiconductor substrate.

5. The method of claim 4 further comprising electrically connecting the bond pads on the second surface of the semiconductor substrate and bond pads formed on the piezoelectric substrate.

6. The method of claim 5 further comprising forming one or more through wafer vias passing through the semiconductor substrate, the one or more through wafer vias providing electrical communication between the bond pads on the second surface of the semiconductor substrate and the bond pads formed on the piezoelectric substrate.

7. The method of claim 1 further comprising hermetically sealing the cavity with a metallic seal ring.

8. The method of claim 1 wherein bonding the semiconductor substrate to the piezoelectric substrate includes bonding the semiconductor substrate to the piezoelectric substrate with a transient liquid phase bond.

9. The method of claim 1 wherein forming the microelectromechanical device includes forming one of a surface acoustic wave filter and a bulk acoustic wave filter.

10. The method of claim 1 wherein fabricating the electronics package includes configuring the electronics package as a flip-chip package.

11. The method of claim 1 further comprising forming a plurality of bond pads on the second surface of the semiconductor substrate.

12. The method of claim 11 further comprising forming solder balls on the plurality of bond pads.

13. The method of claim 11 further comprising bonding the plurality of bond pads to a mounting substrate.

14. The method of claim 13 further comprising depositing a molding compound on the electronics package and the mounting substrate.

15. The method of claim 1 further comprising coating side walls and an upper wall of the cavity with a metal film.

16. The method of claim 1 further comprising forming a second passivation layer on the semiconductor substrate and the one or more passive devices.

17. The method of claim 1 further comprising thinning the semiconductor substrate after bonding the semiconductor substrate to the piezoelectric substrate.

18. The method of claim 1 further comprising thinning the piezoelectric substrate after bonding the semiconductor substrate to the piezoelectric substrate.

19. The method of claim 1 further comprising thinning the semiconductor substrate prior to bonding the semiconductor substrate to the piezoelectric substrate.

20. The method of claim 1 further comprising thinning the piezoelectric substrate prior to bonding the semiconductor substrate to the piezoelectric substrate.

* * * * *